(12) United States Patent
Omori et al.

(10) Patent No.: US 9,953,740 B2
(45) Date of Patent: Apr. 24, 2018

(54) DISPERSANT, METAL PARTICLE DISPERSION FOR ELECTROCONDUCTIVE SUBSTRATES, AND METHOD FOR PRODUCING ELECTROCONDUCTIVE SUBSTRATE

(71) Applicant: DAI NIPPON PRINTING CO., LTD., Tokyo-to (JP)

(72) Inventors: Yoshinobu Omori, Tokyo-to (JP); Naonobu Yoshi, Tokyo-to (JP); Michihiro Ogura, Tokyo-to (JP); Tomoki Murata, Tokyo-to (JP); Mikiko Hojo, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 191 days.

(21) Appl. No.: 14/436,257

(22) PCT Filed: Oct. 17, 2013

(86) PCT No.: PCT/JP2013/078226
§ 371 (c)(1),
(2) Date: Apr. 16, 2015

(87) PCT Pub. No.: WO2014/061750
PCT Pub. Date: Apr. 24, 2014

(65) Prior Publication Data
US 2015/0299364 A1  Oct. 22, 2015

(30) Foreign Application Priority Data

Oct. 18, 2012  (JP) .................................. 2012-231186

(51) Int. Cl.
*H01B 1/22* (2006.01)
*C09D 151/08* (2006.01)
(Continued)

(52) U.S. Cl.
CPC ................. *H01B 1/22* (2013.01); *B05D 5/12* (2013.01); *B22F 1/0062* (2013.01); *B22F 9/24* (2013.01);
(Continued)

(58) Field of Classification Search
CPC . H01B 1/20; H01B 1/22; H05K 1/092; H05K 1/097; H05K 3/10; H05K 3/12;
(Continued)

(56) References Cited

U.S. PATENT DOCUMENTS 4,733,005 A * 3/1988 Schmidt ................ C08F 230/02
560/222
4,738,870 A * 4/1988 Green ...................... C08F 30/02
427/518

(Continued)

FOREIGN PATENT DOCUMENTS

JP           62219229 A     9/1987
JP        2002-324966 A    11/2002
(Continued)

OTHER PUBLICATIONS

English machine translation of JP 2011-228243 A, IDS reference, (2011).*
(Continued)

*Primary Examiner* — Harold Pyon
*Assistant Examiner* — Matthew R Diaz
(74) *Attorney, Agent, or Firm* — Ladas & Parry LLP

(57) ABSTRACT

The present invention is to provide a dispersant which has excellent dispersibility and which is able to inhibit the oxidation of dispersed particles. Disclosed is a dispersant comprising a graft copolymer having a constitutional unit represented by the following general formula (I) and a constitutional unit represented by the following general formula (II):

(Continued)

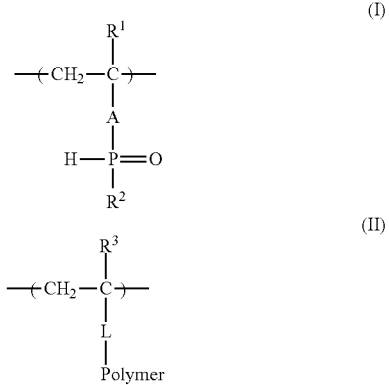

(Symbols shown in the general formulae (I) and (II) are as described in the Description.)

8 Claims, 1 Drawing Sheet

(51) Int. Cl.
| | |
|---|---|
| H05K 1/09 | (2006.01) |
| H05K 3/12 | (2006.01) |
| C08F 30/02 | (2006.01) |
| C08L 39/06 | (2006.01) |
| C08F 275/00 | (2006.01) |
| C08F 8/40 | (2006.01) |
| C08F 226/10 | (2006.01) |
| C08F 26/10 | (2006.01) |
| C09D 139/06 | (2006.01) |
| C09D 11/52 | (2014.01) |
| B05D 5/12 | (2006.01) |
| B22F 1/00 | (2006.01) |
| B22F 9/24 | (2006.01) |
| C08F 290/04 | (2006.01) |
| C08F 230/02 | (2006.01) |
| C08F 265/06 | (2006.01) |
| C09D 5/24 | (2006.01) |
| C09D 7/12 | (2006.01) |
| C09D 151/00 | (2006.01) |
| C08L 39/04 | (2006.01) |
| C08F 220/18 | (2006.01) |
| C08L 33/06 | (2006.01) |

(52) U.S. Cl.
CPC ............... *C08F 8/40* (2013.01); *C08F 26/10* (2013.01); *C08F 30/02* (2013.01); *C08F 226/10* (2013.01); *C08F 230/02* (2013.01); *C08F 265/06* (2013.01); *C08F 275/00* (2013.01); *C08F 290/04* (2013.01); *C08L 39/06* (2013.01); *C09D 5/24* (2013.01); *C09D 7/125* (2013.01); *C09D 11/52* (2013.01); *C09D 139/06* (2013.01); *C09D 151/003* (2013.01); *C09D 151/08* (2013.01); *H05K 1/092* (2013.01); *H05K 3/12* (2013.01); *H05K 3/1283* (2013.01); *C08F 220/18* (2013.01); *C08L 33/06* (2013.01); *C08L 39/04* (2013.01); *H05K 2203/1168* (2013.01)

(58) Field of Classification Search
CPC ...... H05K 3/1283; H05K 3/1291; H05K 3/22; H05K 3/227; H05K 2203/1126; H05K 2203/1142; H05K 2203/1168; C09D 5/24; C09D 11/52; C09D 139/04; C09D 139/06; C09D 139/08; C09D 151/003; C09D 151/06; C09D 151/08; C08F 8/40; C08F 26/06; C08F 26/10; C08F 30/00; C08F 30/02; C08F 126/06; C08F 126/10; C08F 130/00; C08F 130/02; C08F 226/06; C08F 226/10; C08F 275/00; C08F 230/00; C08F 230/02; C08L 39/04; C08L 39/06
See application file for complete search history.

(56) References Cited

U.S. PATENT DOCUMENTS

| | | | | |
|---|---|---|---|---|
| 5,231,131 | A * | 7/1993 | Chu | C08F 290/046 524/504 |
| 5,708,095 | A * | 1/1998 | Grezzo Page | C08F 275/00 347/100 |
| 2003/0232916 | A1* | 12/2003 | Lorah | A01N 25/10 524/502 |
| 2004/0026671 | A1* | 2/2004 | Van den Bergen | C07F 9/091 252/601 |
| 2012/0267151 | A1* | 10/2012 | Hojo | H05K 1/097 174/257 |
| 2012/0280186 | A1 | 11/2012 | Sano et al. | |

FOREIGN PATENT DOCUMENTS

| | | | |
|---|---|---|---|
| JP | 2003049038 A | * | 2/2003 |
| JP | 2004-250658 A | | 9/2004 |
| JP | 2005-500436 A | | 1/2005 |
| JP | 2006-257484 A | | 9/2006 |
| JP | 2008-127679 A | | 6/2008 |
| JP | 4697356 B1 | | 3/2011 |
| JP | 2011-228243 A | | 11/2011 |
| WO | 03/016217 A1 | | 2/2003 |
| WO | 2011/040189 A1 | | 4/2011 |

OTHER PUBLICATIONS

English machine translation of JP 2003-049038 A (2003).*
International Search Report dated Jan. 7, 2014; PCT/JP2013/078226.

* cited by examiner

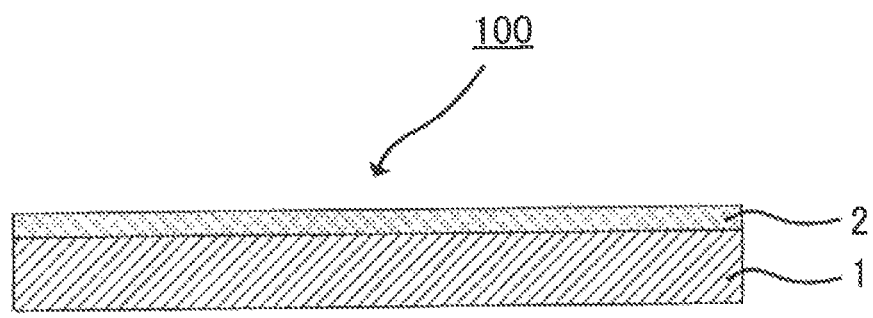

DISPERSANT, METAL PARTICLE DISPERSION FOR ELECTROCONDUCTIVE SUBSTRATES, AND METHOD FOR PRODUCING ELECTROCONDUCTIVE SUBSTRATE

TECHNICAL FIELD

The present invention relates to a dispersant, a metal particle dispersion for electroconductive substrates, and a method for producing an electroconductive substrates.

BACKGROUND ART

Conventionally, for the production of a circuit board comprising a base material and electroconductive wirings formed thereon, various methods have been used, such as a method of applying a photoresist onto a metal foil attached to a base material, exposing the photoresist to light through a desired circuit pattern, and forming a pattern by chemical etching. In this photoresist method, a metal foil is used to form electroconductive wirings, so that an electroconductive substrate with a small volume resistivity and high performance can be produced. On the other hand, this method has disadvantages such that it requires many steps and is thus a complicated method, and it requires photoresist materials.

Recently, a circuit pattern forming method has attracted attention, which forms a circuit pattern by directly printing a pattern on a base material, using a metal particle dispersion having metal particles dispersed therein and by a printing process such as screen printing or inkjet printing, and then sintering the metal particles. Compared to conventional photoresist methods, etc., the method of directly printing a pattern on a base material can increase productivity dramatically higher.

For metal particles, it is known that the melting point is dramatically decreased by reducing the size. This is because as the particle diameter decreases, the specific surface area increases and thus the surface energy increases. By using this effect, the sintering of metal particles can be promoted at lower temperature than ever before. Accordingly, it has been expected that it would be possible to form circuits on resin base materials with low heat resistance, which have been difficult to use, by printing. However, as the particle diameter decreases, it is more difficult to prepare a dispersion with excellent dispersibility and dispersion stability.

In Patent Literature 1, a method of forming circuit patterns by inkjet printing and using an electroconductive metal paste is disclosed. In Patent Literature 1, to prevent ultrafine metal particles from direct contact with each other, a method of covering the ultrafine metal particles with a compound is disclosed, the compound having a group containing nitrogen, oxygen and sulfur atoms that are able to coordinately bind to metal elements contained in the ultrafine metal particles. In Patent Literature 1, alkylamine, alkanethiol, alkanediol and the like are provided as the compound having a group containing nitrogen, oxygen and sulfur atoms, which is used to coat the metal surface. In Patent Literature 1, a relatively low molecular weight compound having 4 to 20 carbon atoms is provided as a concrete example, so that the alkylamine and the like can be detached from the metal, surface when the electroconductive metal paste is baked.

A metal-dispersed liquid is disclosed in Patent Literature 2, which contains metal particles having a mercaptocarboxylic acid and/or a salt thereof on the particle surface, a cationic surfactant and a non-aqueous solvent with low polarity. Patent Literature 2 describes that the mercaptocarboxylic acid or salt thereof on the metal particle surface is dissociated to be electrically negative in the solvent, and the mercaptocarboxylic acid ion is electrostatically bound to the cationic surfactant, thereby allowing the metal particles to maintain dispersion stability in the non-aqueous solvent with low polarity.

However, both the methods of Patent Literatures 1 and 2 disperse metal particles using a low molecular weight compound, and the dispersion stability of the metal particles is insufficient.

A metal microparticle dispersion is disclosed in Patent Literature 3, which contains a specific type of metal microparticles, a polymeric dispersant having a specific polyester skeleton, and a dispersion medium.

Patent Literature 3 describes that the specific polymeric dispersant have a high effect on the dispersibility of the metal microparticles and can be easily volatilized at a subsequent burning step. However, by the method of Patent Literature 3, the storage stability of the metal microparticle dispersion cannot be sufficient; therefore, the metal microparticles sometimes precipitate after a certain period of storage.

A metal-nanoparticle-containing composite is disclosed in Patent Literature 4, which comprises a metal compound, a specific polymer, a reducing agent and an aqueous solution, as a method for forming a metal film having a resistivity sufficiently low in terms of practicality through just drying at room temperature without any special heating-baking step or any step of removing a protective agent with a solvent. According to Patent Literature 4, in the aqueous solution, the sulfide-type sulfur functional group of the specific polymer and the phosphate residue of the same are likely to coordinate to the surfaces of metal nanoparticles; however, by removal of an aqueous solvent, they are dissociated from the surface to cause phase separation between the polymer and the metal nanoparticles, thereby allowing the fusion of the metal nanoparticles to proceed.

In this Patent Literature 4, an aqueous solvent is essential. In the case of using an aqueous solvent, poor coating properties on a base material are obtained, and blister formation is likely to occur; therefore, it is sometimes difficult to form a uniform film. Also in the case of using an aqueous solvent, poor drying properties are obtained; therefore, it takes time to dry a coating film and results in poor productivity. Because of the above reasons, in the production of electroconductive substrates, it is needed to form a film with an organic solvent in view of ease of handling.

Also in the method of Patent Literature 4, the specific polymer remains in the metal film, so that the resulting electroconductive substrate has insufficient electroconductivity and a problem with the adhesion between the base material and the metal film.

CITATION LIST

Patent Literature 1: Japanese Patent Application Laid-Open (JP-A) No. 2002-324966
Patent Literature 2: JP-A No. 2008-127679
Patent Literature 3: International Publication No. WO2011/040189
Patent Literature 4: JP Patent No. 4,697,356

SUMMARY OF INVENTION

Technical Problem

In the case of dispersing metal particles by using a polymeric dispersant for increasing the dispersibility or dispersion stability of the metal particles, and especially in the case where the metal particles are baked at a low temperature or for a short time, the polymeric dispersant may remain in the resulting metal film and increase the volume resistivity of an electroconductive substrate, so that the thus-obtained electroconductive substrate may not exhibit sufficient performance. On the other hand, in the case of decreasing the amount of the dispersant added or using a low molecular weight dispersant for inhibiting the remaining of the dispersant, the dispersibility and dispersion stability of the metal particles become insufficient.

Also, it sometimes happens that the metal particles are oxidized when baked, thus not being able to obtain high electroconductivity after sintering.

Accordingly, it has been quite difficult to obtain a dispersion which has high dispersibility and dispersion stability and which is able to form a film that shows electroconductivity after baking.

The present invention was achieved in light of the above circumstances. An object of the present invention is to provide: a dispersant which has excellent dispersibility and which is able to inhibit the oxidation of dispersed particles; a metal particle dispersion for electroconductive substrates, which has excellent dispersibility and dispersion stability, in which metal particle precipitation is inhibited, and which inhibits the remaining of organic components in a baked film; and a method for producing an electroconductive substrate, which provides an electroconductive substrate with excellent electroconductivity and which inhibits the remaining of organic components after baking.

Solution to Problem

To achieve the above object, the inventors of the present invention made diligent research and have found that by using specific metal particles in combination with a specific dispersant, it is possible to obtain excellent dispersibility and dispersion stability; moreover, even when baked at a low temperature or for a short time, it is easy to decompose or remove organic components from a film to be obtained, and thus it is possible to form a film that shows high electroconductivity.

The present invention was completed based on this finding.

The dispersant of the present invention comprises a graft copolymer having a constitutional unit represented by the following general formula (I) and a constitutional unit represented by the following general formula (II):

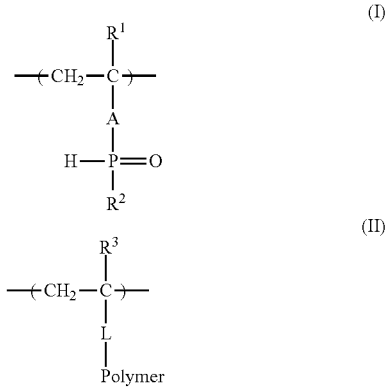

wherein "A" is a direct bond or a divalent linking group; $R^1$ is a hydrogen atom or a methyl group; $R^2$ is a hydrogen atom, a hydrocarbon group or a monovalent group represented by —[CH($R^4$)—CH($R^5$)—O]$_s$—$R^6$, —[(CH$_2$)$_t$—O]$_u$—$R^6$ or —O—$R^7$; $R^7$ is a hydrocarbon group or a monovalent group represented by —[CH($R^4$)—CH($R^5$)—O]$_s$—$R^6$, —[(CH$_2$)$_t$—O]$_u$—$R^6$, —C($R^8$)($R^9$)—C($R^{10}$)($R^{11}$)—OH or —CH$_2$—C($R^{12}$)($R^{13}$)—CH$_2$—OH;

$R^4$ and $R^5$ are each independently a hydrogen atom or a methyl group; $R^6$ is a hydrogen atom, a hydrocarbon group or a monovalent group represented by —CHO, —CH$_2$CHO, —CO—CH=CH$_2$, —CO—C(CH$_3$)=CH$_2$ or —CH$_2$COO$R^{14}$; $R^{14}$ is a hydrogen atom or an alkyl group having 1 to 5 carbon atoms; $R^8$, $R^9$, $R^{10}$, $R^{11}$, $R^{12}$ and $R^{13}$ are each independently a hydrogen atom, a hydrocarbon group or a group in which hydrocarbon groups are bound by at least one of an ether bond and an ester bond, and $R^8$ and $R^{10}$ can be bound to each other to form a cyclic structure; when the cyclic structure is formed, the cyclic structure can have a substituent group $R^{15}$, and $R^{15}$ is a hydrogen atom, a hydrocarbon group or a group in which hydrocarbon groups are bound by at least one of an ether bond and an ester bond;

the hydrocarbon group can have a substituent group;

s is an integer of 1 to 18; t is an integer of 1 to 5; and u is an integer of 1 to 18;

wherein "L" is a direct bond or a divalent linking group; $R^3$ is a hydrogen atom or a methyl group; "Polymer" is a polymer chain having at least one constitutional unit represented by the following general formula (III) or (IV):

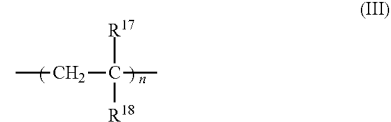

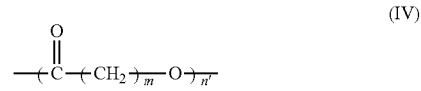

wherein $R^{17}$ is a hydrogen atom or a methyl group; $R^{18}$ is a hydrocarbon group, a cyano group or a monovalent group represented by —[CH($R^{19}$)—CH($R^{20}$—O]$_x$—$R^{21}$, —[(CH$_2$)$_y$—O]$_z$—$R^{21}$, —[CO—(CH$_2$)$_y$—O]$_z$—$R^{21}$, —CO—O—$R^{22}$ or —O—CO—$R^{23}$; $R^{19}$ and $R^{20}$ are each independently a hydrogen atom or a methyl group;

$R^{21}$ is a hydrogen atom, a hydrocarbon group or a monovalent group represented by —CHO, —CH$_2$CHO or —CH$_2$COO$R^{24}$; $R^{22}$ is a hydrocarbon group, a cyano group or a monovalent group represented by —[CH($R^{19}$)—CH($R^{20}$)—O]$_x$—$R^{21}$, —[(CH$_2$)$_y$—O]$_z$—$R^{21}$ or —[CO—(CH$_2$)$_y$—O]$_z$—$R^{21}$, $R^{23}$ is an alkyl group having 1 to 18 carbon atoms; $R^{24}$ is a hydrogen atom or an alkyl group having 1 to 5 carbon atoms;

the hydrocarbon group can have a substituent group;

m is an integer of 1 to 5; n and n' are each an integer of 5 to 200; x is an integer of 1 to 18; y is an integer of 1 to 5; and z is an integer of 1 to 18.

The metal particle dispersion for electroconductive substrates according to the present invention comprises metal particles, a dispersant and an organic solvent, wherein the dispersant is a graft copolymer having a constitutional unit represented by the general formula (I) and a constitutional unit represented by the general formula (II).

The method for producing an electroconductive substrate according to the present invention comprises the steps of:

forming a coating film by applying, onto a base material, a coating solution which contains a metal particle dispersion for electroconductive substrates, comprising metal particles, a dispersant and an organic solvent, wherein the dispersant is a graft copolymer having a constitutional unit represented by the general formula (I) and a constitutional unit represented by the general formula (II), and baking the coating film.

In the dispersant of the present invention, in the metal particle dispersion for electroconductive substrates according to the present invention, and also in the method for producing an electroconductive substrate according to the present invention, it is preferable that the graft copolymer further has a constitutional unit represented by the following general formula (V), from the viewpoint of inhibiting the oxidation of dispersed particles:

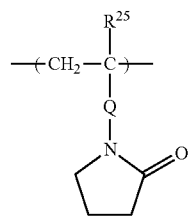

(V)

wherein $R^{25}$ is a hydrogen atom or a methyl group, and "Q" is a direct bond or a divalent linking group.

In the metal particle dispersion for electroconductive substrates according to the present invention and also in the method for producing an electroconductive substrate according to the present invention, it is preferable that the metal particles are metal particles containing one or more selected from the group consisting of gold, silver, copper and oxides thereof, from the point of view that an electroconductive substrate with excellent electroconductivity can be obtained.

Advantageous Effects of Invention

According to the present invention, it is possible to provide: a dispersant which has excellent dispersibility and which is able to inhibit the oxidation of dispersed particles; a metal particle dispersion for electroconductive substrates, which has excellent dispersibility and dispersion stability, in which metal particle precipitation is inhibited, and which inhibits the remaining of organic components in a baked film; and a method for producing an electroconductive substrate, which provides an electroconductive substrate with excellent electroconductivity and which inhibits the remaining of organic components after baking.

BRIEF DESCRIPTION OF DRAWING

FIG. 1 is a schematic view of an example of the electroconductive substrate obtained by the production method of the present invention.

DESCRIPTION OF EMBODIMENTS

Hereinafter, the dispersant, the metal particle dispersion for electroconductive substrates, and the method for producing an electroconductive substrate according to the present invention, will be described.

In the present invention, "(meth)acrylic" means any one of acrylic and methacrylic, and "(meth)acrylate" means any one of acrylate and methacrylate.

[Dispersant]

The dispersant of the present invention comprises a graft copolymer having a constitutional unit represented by the following general formula (I) and a constitutional unit represented by the following general formula (II):

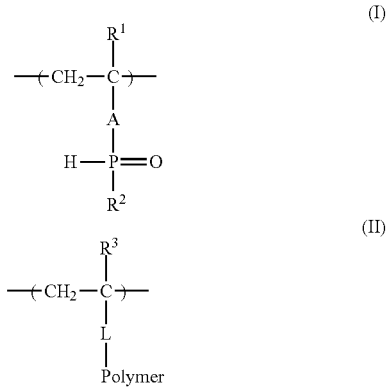

wherein "A" is a direct bond or a divalent linking group; $R^1$ is a hydrogen atom or a methyl group; $R^2$ is a hydrogen atom, a hydrocarbon group or a monovalent group represented by $—[CH(R^4)—CH(R^5)—O]_s—R^6$, $—[(CH_2)_t—O]_u—R^6$ or $—O—R^7$; $R^7$ is a hydrocarbon group or a monovalent group represented by $—[CH(R^4)—CH(R^5)—O]_s—R^6$, $—[(CH_2)_t—O]_u—R^6$, $—C(R^8)(R^9)—C(R^{10})(R^{11})—OH$ or $—CH_2—C(R^{12})(R^{13})—CH_2—OH$;

$R^4$ and $R^5$ are each independently a hydrogen atom or a methyl group; $R^6$ is a hydrogen atom, a hydrocarbon group or a monovalent group represented by $—CHO$, $—CH_2CHO$, $—CO—CH=CH_2$, $—CO—C(CH_3)=CH_2$ or $—CH_2COOR^{14}$; $R^{14}$ is a hydrogen atom or an alkyl group having 1 to 5 carbon atoms; $R^6$, $R^9$, $R^{10}$, $R^{11}$, $R^{12}$ and $R^{13}$ are each independently a hydrogen atom, a hydrocarbon group or a group in which hydrocarbon groups are bound by at least one of an ether bond and an ester bond, and $R^8$ and $R^{10}$ can be bound to each other to form a cyclic structure; when the cyclic structure is formed, the cyclic structure can have a substituent group $R^{15}$, and $R^{15}$ is a hydrogen atom, a hydrocarbon group or a group in which hydrocarbon groups are bound by at least one of an ether bond and an ester bond;

the hydrocarbon group can have a substituent group;

s is an integer of 1 to 18; t is an integer of 1 to 5; and u is an integer of 1 to 18;

wherein "L" is a direct bond or a divalent linking group; $R^3$ is a hydrogen atom or a methyl group; "Polymer" is a polymer chain having at least one constitutional unit represented by the following general formula (III) or (IV):

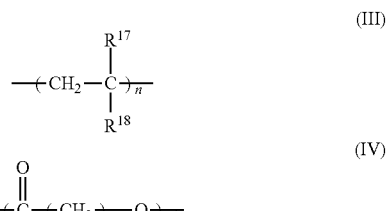

wherein $R^{17}$ is a hydrogen atom or a methyl group; $R^{18}$ is a hydrocarbon group, a cyano group or a monovalent group represented by —[CH($R^{19}$)—CH($R^{20}$)—O]$_x$—$R^{21}$, —[(CH$_2$)$_y$—O]$_z$—$R^{21}$, —[CO—(CH$_2$)$_y$—O]$_z$—$R^{21}$, —CO—O—$R^{22}$ or —O—CO—$R^{23}$; $R^{19}$ and $R^{20}$ are each independently a hydrogen atom or a methyl group;

$R^{21}$ is a hydrogen atom, a hydrocarbon group or a monovalent group represented by —CHO, —CH$_2$CHO or —CH$_2$COO$R^{24}$; $R^{22}$ is a hydrocarbon group, a cyano group or a monovalent group represented by —[CH($R^{19}$)CH($R^{20}$)—O]$_x$—$R^{21}$, —[(CH$_2$)$_y$—O]$_z$—$R^{21}$ or —[CO—(CH$_2$)$_y$—O]$_z$—$R^{21}$; $R^{23}$ is an alkyl group having 1 to 18 carbon atoms; $R^{24}$ is a hydrogen atom or an alkyl group having 1 to 5 carbon atoms;

the hydrocarbon group can have a substituent group;

m is an integer of 1 to 5; n and n' are each an integer of 5 to 200; x is an integer of 1 to 18; y is an integer of 1 to 5; and z is an integer of 1 to 18.

In the graft copolymer contained in the dispersant of the present invention, the phosphine (P—H) site of the constitutional unit represented by the general formula (I) adsorbs to the surfaces of the particles to be dispersed; therefore, increased dispersibility and dispersion stability are obtained. In addition, because the phosphine site has reducing properties, it is presumed that the oxidation of the particles to which the phosphorus atom sites adsorb, is inhibited.

<Constitutional Unit Represented by the General Formula (I)>

In the general formula (I), "A" is a direct bond or a divalent linking group. The direct bond means that the phosphorus atom of the general formula (I) is directly bound to the carbon atom of the general formula (I), not through a linking group.

The divalent linking group as "A" is not particularly limited, as long as it is able to link the carbon atom of the main chain to the phosphorus atom to each other. Examples of the divalent linking group as "A" include a linear, branched or cyclic alkylene group, a linear, branched or cyclic alkylene group having a hydroxyl group, an arylene group, a —CONH— group, a —COO— group, a —NHCOO— group, an ether group (—O— group), a thioether group (—S— group) and combinations thereof. In the present invention, the binding direction of the divalent linking group can be any direction. For example, when —CONH— is contained in the divalent linking group, —CO can be located on the carbon atom side of the main chain and —NH can be located on the phosphorus atom side of the side chain. To the contrary, —NH can be located on the carbon atom side of the main chain and —CO can be located on the phosphorus atom side of the side chain.

In the general formula (I), particularly from the viewpoint of dispersibility, "A" is preferably a divalent linking group containing a —CONH— group or a —COO— group.

For example, when "A" is a divalent linking group containing a —COO— group, the constitutional unit represented by the general formula (I) can be a structure represented by the following formula (I-1), for example:

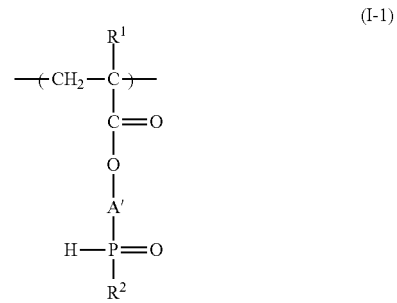

(I-1)

wherein $R^1$ and $R^2$ are the same as the general formula (I); "A'" is an alkylene group which has 1 to 8 carbon atoms and which can have a hydroxyl group, —[CH($R^a$)—CH($R^b$)—O]$_x$—, —[(CH$_2$)$_y$—O]$_z$—(CH$_2$)$_y$—O— or —[CH($R^c$)]$_w$—O—; $R^a$, $R^b$ and $R^c$ are each independently a hydrogen atom, a methyl group or a hydroxyl group; x is an integer of 1 to 18; y is an integer of 1 to 5; z is an integer of 1 to 18; and w is an integer of 1 to 18.

The alkylene group having 1 to 8 carbon atoms as "A'" can be any of linear, branched and cyclic. Examples thereof include a methylene group, an ethylene group, a trimethylene group, a propylene group, various types of butylene groups, various types of pentylene groups, various types of hexylene groups and various types of octylene groups. A part of the hydrogen atoms of the alkylene group can be substituted with a hydroxyl group.

Also, x is an integer of 1 to 18, preferably an integer of 1 to 4, more preferably an integer of 1 to 2; y is an integer of 1 to 5, preferably an integer of 1 to 4, more preferably 2 or 3; z is an integer of 1 to 18, preferably an integer of 1 to 4, more preferably an integer of 1 to 2; and w is an integer of 1 to 18, more preferably in integer of 1 to 4.

In the general formula (I), preferred concrete examples as "A" include, but not limited to, —COO—CH$_2$CH(OH)CH$_2$—O—, —CONH— and —COO—.

Examples of the hydrocarbon group as $R^6$ and $R^7$ and as $R^8$, $R^9$, $R^{10}$, $R^{11}$, $R^{12}$ and $R^{13}$ include an alkyl group having 1 to 18 carbon atoms, an alkenyl group having 2 to 18 carbon atoms, an aralkyl group and an aryl group.

The alkyl group having 1 to 18 carbon atoms can be linear, branched or cyclic. Examples thereof include a methyl group, an ethyl group, an n-propyl group, an isopropyl group, an n-butyl group, a cyclopentyl group, a cyclohexyl group, a bornyl group, an isobornyl group, a dicyclopentanyl group, an adamantyl group, and a lower alkyl group-substituted adamantyl group.

The alkenyl group having 2 to 18 carbon atoms can be linear, branched or cyclic. Examples of such an alkenyl group include a vinyl group, an allyl group and a propenyl group. The position of the double bond of the alkenyl group is not limited. From the viewpoint of the reactivity of the resulting polymer, the double bond is preferably located at the terminal of the alkenyl group.

Examples of the aryl group include a phenyl group, a biphenyl group, a naphthyl group, a tolyl group and a xylyl group. The aryl group can further have a substituent group. The aryl group preferably has 6 to 24 carbon atoms, more preferably 6 to 12 carbon atoms.

Examples of the aralkyl group include a benzyl group, a phenethyl group, a naphthylmethyl group and a biphenylmethyl group. The aralkyl group can further have a substituent group. The aralkyl group preferably has 7 to 20 carbon atoms, more preferably 7 to 14 carbon atoms.

The alkyl group or alkenyl group can have a substituent group. Examples of the substituent group include a halogen atom such as F, Cl or Br and a nitro group.

Examples of the substituent group of the aromatic ring of the aryl group, aralkyl group, etc., include a linear or branched alkyl group having 1 to 4 carbon atoms, an alkenyl group, a nitro group and a halogen atom.

The preferable number of carbon atoms does not include the number of the carbon atoms of the substituent group.

In $R^2$ and $R^7$, s is an integer of 1 to 18; t is an integer of 1 to 5; and u is an integer of 1 to 18. Also, s is preferably an integer of 1 to 4, more preferably an integer of 1 to 2; t is preferably an integer of 1 to 4, more preferably 2 or 3; and u is preferably an integer of 1 to 4, more preferably an integer of 1 to 2.

The group in which hydrocarbon groups are bound by at least one of an ether bond and an ester bond, as $R^8$, $R^9$, $R^{10}$, $R^{11}$, $R^{12}$ and $R^{13}$, is a group represented by —R'—O—R", —R'—(C═O)—O—R" or —R'—O—(C═O)—R" (wherein R' and R" are each a hydrocarbon group or a group in which hydrocarbon groups are bound by at least one of an ether bond and an ester bond). Two or more ether bonds and ester bonds can be contained per group. When the hydrocarbon group is monovalent, examples thereof include an alkyl group, an alkenyl group, an aralkyl group and an aryl group. When the hydrocarbon group is divalent, examples thereof include an alkylene group, an alkenylene group, an arylene group and combinations thereof.

When $R^8$ and $R^{10}$ are bound to each other to form a cyclic structure, the number of carbon atoms forming the cyclic structure is preferably 5 to 8. The number is more preferably 6, that is, the cyclic structure is more preferably a 6-membered ring structure, and still more preferably a cyclohexane ring.

The substituent group $R^{15}$ is a hydrocarbon group or a group in which hydrocarbon groups are bound by at least one of an ether bond and an ester bond. They can be the same as those described above in the description of $R^8$, $R^9$, $R^{10}$, $R^{11}$, $R^{12}$ and $R^{13}$.

The constitutional unit represented by the general formula (I) is preferably such that $R^2$ in the general formula (I) is a hydrogen atom, hydroxyl group, a methyl group, an ethyl group, an aryl group or aralkyl group which can have a substituent group, a vinyl group, an allyl group or a monovalent group represented by —[CH($R^4$)—CH($R^5$)—O]$_s$—$R^6$, —[(CH$_2$)$_t$—O]$_u$—$R^6$ or —O—$R^7$; $R^7$ is a methyl group, an ethyl group, an aryl group or aralkyl group which can have a substituent group, a vinyl group, an allyl group, —[CH($R^4$)—CH($R^5$)—O]$_s$—$R^6$ or —[(CH$_2$)$_t$—O]$_u$—$R^6$; $R^4$ and $R^5$ are each independently a hydrogen atom or a methyl group; and $R^6$ is —CO—CH═CH$_2$ or —CO—C(CH$_3$)═CH$_2$, from the point of view that excellent particle dispersibility and dispersion stability can be obtained. Of them, from the viewpoint of dispersibility, an aryl group which can have a substituent group is preferred. From the viewpoint of increasing reducing ability and inhibiting the oxidation of dispersed particles, $R^2$ is preferably a hydrogen atom.

<Constitutional Unit Represented by the General Formula (II)>

The graft copolymer has the constitutional unit represented by the general formula (II), which contains a polymer chain at a side chain thereof. Therefore, excellent solvent affinity can be obtained, and excellent particle dispersibility and dispersion stability can be obtained.

In the general formula (II), "L" is a direct bond or a divalent linking group. The divalent linking group as "L" is not particularly limited, as long as it is able to link the carbon atom derived from the ethylenically unsaturated double bond and the polymer chain to each other. Examples of the divalent linking group as "L" include a linear, branched or cyclic alkylene group, a linear, branched or cyclic alkylene group having a hydroxyl group, an arylene group, a —CONH— group, a —COO— group, a —NHCOO— group, an ether group (—O— group), a thioether group (—S— group) and combinations thereof. In the present invention, the binding direction of the divalent linking group can be any direction. For example, when —CONH— is contained in the divalent linking group, —CO can be located on the carbon atom side of the main chain and —NH can be located on the polymer chain side of the side chain. To the contrary, —NH can be located on the carbon atom side of the main chain and —CO can be located on the polymer chain side of the side chain.

In the general formula (II), "Polymer" is a polymer chain having at least one constitutional unit represented by the general formula (III) or (IV).

In the formula (III), $R^{17}$ is a hydrogen atom or a methyl group, and $R^{18}$ is a hydrocarbon group, a cyano group or a monovalent group represented by —[CH($R^{19}$)—CH($R^{20}$)—O]$_x$—$R^2$, —[(CH$_2$)$_y$—O]$_z$—$R^{21}$, —[CO—(CH$_2$)$_y$—O]$_z$—$R^{21}$, —CO—O—$R^{22}$ or —O—CO—$R^{23}$.

The hydrocarbon group as $R^{18}$ is preferably an alkyl group having 1 to 18 carbon atoms, an alkenyl group having 2 to 18 carbon atoms, an aralkyl group or an aryl group.

The alkyl group having 1 to 18 carbon atoms can be linear, branched or cyclic. Examples thereof include a methyl group, an ethyl group, an n-propyl group, an isopropyl group, an n-butyl group, a cyclopentyl group, a cyclohexyl group, a bornyl group, an isobornyl group, a dicyclopentanyl group, an adamantyl group, and a lower alkyl group-substituted adamantyl group.

The alkenyl group having 2 to 18 carbon atoms can be linear, branched or cyclic. Examples of such an alkenyl group include a vinyl group, an allyl group and a propenyl group.

Examples of the aryl group as $R^{18}$ include a phenyl group, a biphenyl group, a naphthyl group, a tolyl group and a xylyl group. The aryl group preferably has 6 to 24 carbon atoms, more preferably 6 to 12 carbon atoms.

Examples of the aralkyl group as $R^{18}$ include a benzyl group, a phenethyl group, a naphthylmethyl group and a biphenylmethyl group. The aralkyl group preferably has 1 to 20 carbon atoms, more preferably 7 to 14 carbon atoms.

$R^{21}$ is a hydrogen atom, an alkyl group having 1 to 18 carbon atoms, an aralkyl group, an aryl group or a monovalent group represented by —CHO, —CH$_2$CHO or —CH$_2$COOR$^{24}$. $R^{22}$ is an alkyl group having 1 to 18 carbon atoms, an aralkyl group, an aryl group, a cyano group or a monovalent group represented by —[CH($R^{19}$)—CH($R^{20}$)—O]$_x$—$R^{21}$, —[(CH$_2$)$_y$—O]$_z$—$R^{21}$ or —[CO—(CH$_2$)$_y$—O]$_z$—$R^{21}$. $R^{23}$ is an alkyl group having 1 to 18 carbon atoms. $R^{24}$ is a hydrogen atom or an alkyl group having 1 to 5 carbon atoms.

The alkyl group having 1 to 18 carbon atoms, the aralkyl group and the aryl group as $R^{21}$ and $R^{22}$ are as described above in the description of $R^{18}$.

The alkyl group as $R^{23}$ and $R^{24}$ is as described above in the description of $R^{18}$.

When $R^{18}$, $R^{21}$, $R^{22}$ and $R^{23}$ are each a group having an aromatic ring, the aromatic ring can further have a substituent group. Examples of the substituent group include a linear, branched or cyclic alkyl group having 1 to 5 carbon atoms, an alkenyl group, a nitro group and a halogen atom such as F, Cl or Br.

The preferable number of carbon atoms does not include the number of the carbon atoms of the substituent group.

In $R^{18}$ and $R^{22}$, x is an integer of 1 to 18; y is an integer of 1 to 5; and z is an integer of 1 to 18. Also, x is preferably an integer of 1 to 4, more preferably an integer of 1 to 2; y is preferably an integer of 1 to 4, more preferably 2 or 3; and z is preferably an integer of 1 to 4, more preferably an integer of 1 to 2.

Also, $R^{18}$, $R^{21}$, $R^{22}$ and $R^{23}$ can be further substituted with a substituent group such as an alkoxy group, a hydroxyl group, a carboxyl group, an amino group, an epoxy group, an isocyanate group or a hydrogen bond-forming group, to the extent that does not deteriorate the dispersing performance or the like of the graft copolymer. Also, after synthesizing the graft copolymer having such a substituent group, a polymerizable group can be added thereto by reaction with a compound having a functional group that is reactive with the substituent group and the polymerizable group. For example, a polymerizable group can be added by reacting the graft copolymer having a carboxyl group with glycidyl (meth)acrylate, or reacting the graft copolymer having an isocyanate group with hydroxyethyl (meth)acrylate.

Of the above-mentioned constitutional units, the polymer chain contained in the constitutional unit represented by the general formula (III) preferably has a constitutional unit derived from, but not limited to, methyl (meth)acrylate, ethyl (meth)acrylate, isopropyl (meth)acrylate, n-butyl (meth)acrylate, isobutyl (meth)acrylate, tert-butyl (meth) acrylate, 2-ethylhexyl (meth)acrylate, 2-ethoxyethyl (meth) acrylate, cyclohexyl (meth)acrylate, benzyl (meth)acrylate, phenyl (meth)acrylate, isobornyl (meth)acrylate, dicyclopentanyl (meth)acrylate, adamantyl (meth)acrylate, styrene, α-methylstyrene, vinylcyclohexane, etc.

In the general formula (IV), m is an integer of 1 to 5, preferably an integer of 2 to 5, more preferably an integer of 4 or 5. The unit numbers n and n' of the constitutional unit of the polymer chain can be each an integer of 5 to 200 and are not particularly limited. However, they are preferably in a range of 5 to 100.

In the present invention, as $R^{18}$ and $R^{22}$, it is preferable to use a group that has excellent solubility in the below-described organic solvent, and they can be appropriately selected depending on the organic solvent used for the metal particle dispersion. In particular, for example, when the organic solvent used is an organic solvent that is generally used for metal particle dispersions, such as an ether alcohol acetate-based organic solvent, an ether-based organic solvent or an ester-based organic solvent, preferred as $R^{18}$ and $R^{22}$ are a methyl group, an ethyl group, an isobutyl group, an n-butyl group, a 2-ethylhexyl group, a benzyl group, etc.

The reason why $R^{18}$ and $R^{22}$ are determined in this way is that particularly excellent metal particle dispersibility and dispersion stability can be obtained when the constitutional unit containing $R^{18}$ or $R^{22}$ has solubility in the organic solvent and the salt-forming site formed by the basic site of the monomer has high adsorption properties to metal particles.

The mass average molecular weight Mw of the polymer chain as the Polymer is preferably in a range of 500 to 15,000, more preferably in a range of 1,000 to 8,000. When the mass average molecular weight is in the range, the dispersant can keep a sufficient steric repulsion effect, and an increase in the time required to disperse the metal particles can be inhibited by the steric effect.

As an indication, it is preferable that the polymer chain as the "Polymer" has a solubility of 50 (g/100 g solvent) or more at 23° C., in the organic solvent used in combination.

The solubility of the polymer chain can be determined by whether or not the material which is used for introducing the polymer chain when preparing the graft copolymer has the above solubility. For example, when a polymerizable oligomer containing a polymer chain and a group having an ethylenically unsaturated double bond at a terminal of the chain is used for introducing a polymer chain into the graft copolymer, the polymerizable oligomer is needed to have the above solubility. When a copolymer is formed by monomers each containing a group having an ethylenically unsaturated double bond, and then a polymer chain is introduced into the graft copolymer by a polymer chain having a reactive group that is reactive with the reactive group contained in the copolymer, the polymer chain having the reactive group is needed to have the solubility.

The polymer chain can be a homopolymer or copolymer. In the graft copolymer, the polymer chain contained in the constitutional unit represented by the general formula (II) can be one kind of polymer chain or a combination of two or more kinds of polymer chains.

In the graft copolymer, the content of the constitutional unit represented by the general formula (I) is preferably 3 to 80% by mass, more preferably 5 to 50% by mass, still more preferably 10 to 40% by mass. When the content of the constitutional unit represented by the general formula (I) in the graft copolymer is in the range, the content of the site with an affinity for the particles in the graft copolymer can be appropriate, and a decrease in the solubility in the organic solvent can be inhibited. Therefore, excellent adsorbing properties to the metal particles can be obtained, and excellent dispersibility and dispersion stability can be obtained.

The content ratios of the constitutional units can be calculated from the amounts of the constitutional units used to synthesize the graft copolymer having the constitutional unit represented by the general formula (I).

The weight average molecular weight Mw of the graft copolymer is preferably in a range of 1,000 to 100,000, more preferably in a range of 3,000 to 30,000, still more preferably in a range of 5,000 to 20,000. The metal particles can be uniformly dispersed when the weight average molecular weight is in the range.

The weight average molecular weight Mw is a value measured by gel permeation chromatography (GPC). The measurement was carried out by using HLC-8120GPC manufactured by Tosoh Corporation and the following: the elution solvent used is N-methylpyrrolidone mixed with 0.01 mol/l lithium bromide; the polystyrene standards for calibration curve used are Mw 377400, 210500, 96000, 50400, 20650, 10850, 5460, 2930, 1300 and 580 (the Easi PS-2 series manufactured by Polymer Laboratories) and Mw 1090000 (manufactured by Tosoh Corporation); and the measurement columns used are two TSK-GEL ALPHA-M columns (manufactured by Tosoh Corporation).

In addition to the constitutional unit represented by the general formula (I) and the constitutional unit represented by the general formula (II), the graft copolymer used in the present invention can further have other constitutional unit. Other constitutional unit can be introduced by appropriately selecting an ethylenically unsaturated double bond-containing monomer, which is copolymerizable with an ethylenically unsaturated double bond-containing monomer that derives the constitutional unit represented by the general formula (I), and copolymerizing them.

In the present invention, it is particularly preferable that the graft copolymer further has a constitutional unit represented by the following general formula (V):

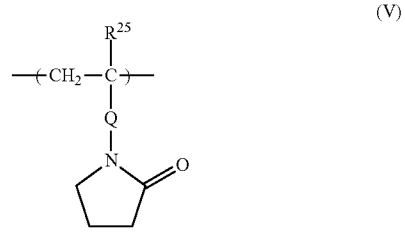

(V)

wherein $R^{25}$ is a hydrogen atom or a methyl group, and "Q" is a direct bond or a divalent linking group.

The constitutional unit represented by the general formula (V) not only adsorbs to various kinds of particles to be dispersed but also has reducing properties. Therefore, it is presumed that the oxidation of adsorbed particles is inhibited or oxide particles are reduced. Accordingly, when the graft copolymer has the constitutional unit represented by the general formula (V), oxidation-induced decomposition of dispersed particles is inhibited. In the case of using such a graft copolymer for the metal particle dispersion for electroconductive substrates, the resulting electroconductive substrate has an excellent electroconductivity.

In the general formula (V), "Q" is a direct bond or a divalent linking group. The direct bond means that the nitrogen atom of the pyrrolidone is directly bound to the carbon atom of the general formula (V), not through a linking group.

Examples of the divalent linking group as "Q" include an alkylene group having 1 to 10 carbon atoms, an arylene group, a —CONH— group, a —COO— group, an ether group having 1 to 10 carbon atoms (—R'—OR"— wherein R' and R" are each independently an alkylene group) and combinations thereof.

In the general formula (V), "Q" is preferably a direct bond, an alkylene group having 1 to 10 carbon atoms, or a divalent linking group containing a —COO— group.

(Method for Producing the Graft Copolymer)

In the present invention, the method for producing the graft copolymer is not particularly limited, as long as it is a method that is able to produce a graft copolymer having the constitutional unit represented by the general formula (I) and the constitutional unit represented by the general formula (II). For example, there may be mentioned a method for producing a graft copolymer by copolymerizing at least a monomer represented by the following general formula (I'), a polymerizable oligomer comprising a polymer chain having at least one constitutional unit represented by the general formula (III) or (IV) and a group having an ethylenically unsaturated double bond at a terminal of the chain, and, as needed, vinylpyrrolidone, which are contained as copolymerizable components. Also, there may be mentioned a method of obtaining the constitutional unit represented by the general formula (I) by copolymerizing the constitutional unit represented by the general formula (II) and a monomer having a reactive group such as a glycidyl group and then adding a phosphinic acid having a desired structure to the monomer having the reactive group. The graft copolymer can be produced by further using other monomer as needed, and by using a known polymerization method.

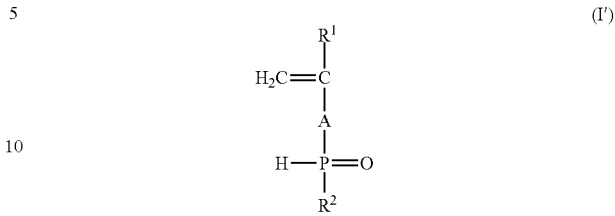

(I')

In the general formula (I'), $R^1$, $R^2$ and "A" are the same as the general formula (I).

Also, after a copolymer is formed by addition polymerization of the monomer represented by the general formula (I') and a monomer containing a reactive group and a group having an ethylenically unsaturated double bond, a polymer chain can be introduced into the copolymer by using a polymer chain containing a reactive group that is reactive with the reactive group contained in the copolymer. In particular, for example, after a copolymer having a substituent group such as an alkoxy group, a hydroxyl group, a carboxyl group, an amino group, an epoxy group, an isocyanate group or a hydrogen bond-forming group is synthesized, a polymer chain can be introduced into the copolymer by reacting the substituent group with a polymer chain containing a functional group that is reactive with the substituent group.

For example, a polymer chain can be introduced by reacting a copolymer having a carboxyl group at a side chain thereof with a polymer chain having a glycidyl group at the terminal thereof, or by reacting a copolymer having an isocyanate group at a side chain thereof with a polymer chain having a hydroxy group at the terminal thereof.

In the polymerization, additives that are generally used for polymerization, such as a polymerization initiator, a dispersion stabilizer and a chain transfer agent, can be used.

The monomer represented by the general formula (I') can be obtained by, for example, reacting a phosphinic acid compound having a desired structure with a compound having a glycidyl group, an oxetane group, a hydroxyl group or the like and an ethylenically unsaturated double bond.

In the graft copolymer, the content of the constitutional unit represented by the general formula (I) is preferably 3 to 80% by mass, more preferably 5 to 50% by mass, still more preferably 10 to 40% by mass. When the content of the constitutional unit represented by the general formula (I) in the graft copolymer is in the range, the content of the site with an affinity for the particles can be appropriate, and a decrease in the solubility in the organic solvent can be inhibited. Therefore, excellent absorbing properties to the metal particles can be obtained, and excellent dispersibility and dispersion stability can be obtained.

In the present invention, the content ratios of the constitutional units in the graft copolymer can be calculated from the amounts of the constitutional units used to synthesize the graft copolymer.

When the constitutional unit represented by the general formula (V) is contained in the graft copolymer, the content of the constitutional unit represented by the general formula (V) is preferably 5 to 50% by mass, more preferably 10 to 40% by mass.

Particles that are dispersible with the dispersant of the present invention are not limited to the below-described metal particles. The dispersant of the present invention is able to appropriately disperse metal particles, metal oxides and pigments, for example. In the dispersant of the present invention, the constitutional unit represented by the general formula (I) has high affinity for particles to be dispersed and reducing properties. Therefore, for example, when an organic pigment is dispersed, excellent dispersibility and dispersion stability of the organic pigment can be obtained, and oxidation-induced color deterioration can be prevented.

[Metal Particle Dispersion for Electroconductive Substrates]

The metal particle dispersion for electroconductive substrates according to the present invention comprises metal particles, a dispersant and an organic solvent, wherein the dispersant is a graft copolymer having a constitutional unit represented by the following general formula (I) and a constitutional unit represented by the following general formula (II):

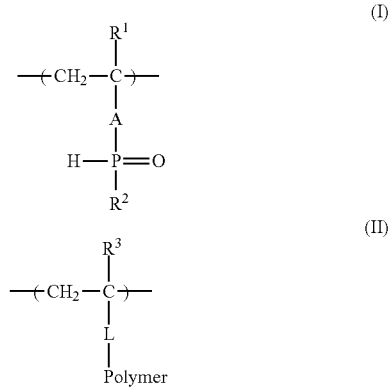

The symbols in the general formulae (I) and (II) are as described above.

In the metal particle dispersion for electroconductive substrates according to the present invention, the metal particles are dispersed with the dispersant of the present invention. Therefore, the precipitation of the metal particles does not occur in the organic solvent; excellent dispersibility and dispersion stability can be obtained; the oxidation of the metal particles can be inhibited; or the metal oxide contained in the metal particles is reduced. Accordingly, the resulting electroconductive substrate has excellent electroconductivity.

The mechanism that the effect as specified above is exerted by the above-specified combination, is not completely clear. However, it is presumed as follows.

Conventionally, relatively low molecular weight dispersants have been used in metal particle dispersions, for inhibiting the remaining of organic components after baking. However, in the case of using low molecular weight dispersants, insufficient dispersibility and dispersion stability are obtained. Especially, since metal particles have larger specific gravity than other components in dispersions, there is a problem that they precipitate during storage.

In the metal particle dispersion of the present invention, the metal particles are dispersed by using, as the dispersant, the graft copolymer having the constitutional unit represented by the general formula (I). Accordingly, it is presumed that the phosphorus-containing site in the dispersant becomes insoluble in solvent and firmly adsorbs to the metal particle surface; therefore, the dispersion of the metal particles is stabilized. As just described, since the above-specified dispersant surrounds the metal particles and is stably present in the organic solvent, it is presumed that the aggregation of the metal particles is less likely to occur; excellent dispersibility and dispersion stability are obtained; and the precipitation of the metal particles can be inhibited.

Also, in the case of using the above-specified dispersant, organic components can be easily decomposed or removed from the film, even when baked at a low temperature of for a short time. Therefore, the dispersant is less likely to remain, and the thus-obtained metal film has a low volume resistivity and excellent electroconductivity. This mechanism is not clear yet. However, in the case of using the above-specified dispersant, higher metal particle dispersibility is obtained, and the size of the dispersed particles becomes smaller, compared to conventional polymer dispersants. Therefore, it is presumed that the metal particles can be easily fused, and the above-specified dispersant can be easily decomposed or volatilized even at a relatively low temperature.

In addition, it is presumed that in the above-specified dispersant, the phosphine (P—H) site contained in the constitutional unit represented by the general formula (I) has reducing properties or an oxidation inhibiting effect. It is presumed that excellent electroconductivity can be achieved by these synergistic effects.

The metal particle dispersion for electroconductive substrates according to the present invention comprises the metal particles, the dispersant and the organic solvent. It can further contain other components as needed, to the extent that does not deteriorate the effects of the present invention.

Hereinafter, the components of the metal particle dispersion for electroconductive substrates according to the present invention will be described. However, the dispersant will not be described here, since it is as described above in the description of the dispersant of the present invention.

<Metal Particles>

In the present invention, the metal particles can be appropriately selected from various types of metal particles that show electroconductivity after baking. Examples of the metal types include gold, silver, copper, nickel, tin, iron, chromium, platinum, palladium, rhodium, iridium, ruthenium, osmium, indium, zinc, molybdenum, manganese, titanium and aluminum. In the present invention, "metal particles" encompass not only particles in a metal state but also particles in an alloy state, particles of a metal compound, etc. For example, "metal particles" can be particles each containing one or more selected from the group consisting of a metal, an alloy and a metal compound, such as the case where the surface of particles in a metal state is oxidized into a metal oxide, or the case where a core-shell structure is formed by two or more kinds of metals.

The metal particles are preferably metal particles containing one or more selected from the group consisting of gold, silver, copper, nickel and oxides thereof, and more preferably metal particles containing one or more selected from the group consisting of gold, silver, copper and oxides thereof, from the viewpoint of having high electroconductivity and easily maintaining the particles.

Examples of the metal compound include a metal oxide, a metal hydroxide and an organic metal compound. Preferably, these metal compounds are those that can be decomposed and put in a metal state when baked. Examples of metal compounds having silver include silver oxides and organic silver compounds. Examples of metal compounds having copper include copper oxides such as copper(I) oxide, copper(II) oxide and mixtures thereof.

Examples of the alloy include a copper-nickel alloy, a silver-palladium alloy, a copper-tin alloy, a silver-copper alloy, and a copper-manganese alloy.

The surface of the metal particles can be coated with an organic protective agent.

The metal particles can be composed of one or more types of metal particles each containing one or more selected from the group consisting of the above-mentioned metals, alloys and metal compounds.

The method for preparing the metal particles can be appropriately selected from conventionally known methods. For example, the metal particles can be obtained by: physical methods of grinding metal powder by mechanochemical treatment, etc.; chemical dry methods such as a chemical vapor deposition (CVD) method, a vapor deposition method, a sputtering method, a thermal plasma method and a laser method; and chemical wet methods such as a thermal decomposition method, a chemical reduction method, an electrolysis method, a ultrasonication method, a laser ablation method, a supercritical fluid method and a microwave synthesis method.

For example, in the vapor deposition method, fine particles are produced by bringing a thermally evaporated metal vapor into contact with a low vapor pressure liquid containing a dispersant, under high vacuum.

An example of the chemical reduction method is a method of producing fine particles by mixing a metal oxide and a reducing agent in an organic solvent, in the presence of a complexing agent and an organic protective agent.

The complexing agent is such an agent that the donor atom of the ligand of the complexing agent binds to a metal ion or atom to form a metal complex compound. As the donor atom, a nitrogen atom, an oxygen atom and a sulfur atom are preferred. Examples of complexing agents in which the donor atom is a nitrogen atom include, but not limited to, amines and nitrogen-containing heterocyclic ring compounds such as imidazole and pyridine.

The organic protective agent is used to stabilize the dispersion of refined metal particles or to control the particle diameter. Concrete examples thereof include: protein-based organic protective agents such as gelatin, arabic gum and casein; natural polymers such as starch and dextrin; cellulose-based organic protective agents such as hydroxyethyl cellulose; and hydrophilic synthetic polymers such as polyvinyl alcohol. Also, the organic protective agent can be a relatively low molecular weight compound such as fatty acid or alkylamine. Among them, protein-based organic protective agents are preferred, from the viewpoint of dispersion stability.

In addition to the above methods, commercially-available metal particles can be appropriately used.

The average primary particle diameter of the metal particles can be appropriately determined, depending on the intended use. In general, it is determined in a range of 1 to 1,000 nm. From the point of view that excellent dispersibility and dispersion stability can be obtained and precipitates are less likely to occur, the average primary particle diameter of the metal particles is preferably 2 to 500 nm.

The average primary particle diameter of the metal particles can be obtained by the method of directly measuring the size of primary particles shown on an electron microscopy image. More specifically, the short-axis and long-axis diameters of each primary particle are measured, and the average was used as the particle diameter of each particle. Next, for 100 or more particles, the volume (mass) of each particle was obtained by approximating its volume (mass) by the volume (mass) of a cuboid with the above-obtained particle diameter, and the volume average particle diameter was obtained therefrom and used as the average particle diameter. The same result can be obtained by using any of a transmission electron microscope (TEM), scanning electron microscope (SEM) and scanning transmission electron microscope (STEM) as the electron microscope.

In the metal particle dispersion for electroconductive substrates according to the present invention, the content of the metal particles can be appropriately determined, depending on the intended use. From the viewpoint of dispersibility, the content is preferably in a range of 5 to 95% by mass, more preferably in a range of 20 to 90% by mass, with respect to the total amount of the metal particle dispersion. In the present invention, by using the metal particles in combination with the below-described dispersant, excellent metal particle dispersibility and dispersion stability can be obtained and precipitates are less likely occur, even when the content of the metal particles is higher than ever before.

<Organic Solvent>

In the metal particle dispersion of the present invention, the organic solvent is not particularly limited, as long as it is not reactive with the components in the metal particle dispersion and it is able to dissolve or disperse them. Concrete examples thereof include the following organic solvents: alcohol-based organic solvents such as methyl alcohol, ethyl alcohol, N-propyl alcohol and isopropyl alcohol; ether alcohol-based organic solvents such as methoxy alcohol, ethoxy alcohol, methoxy ethoxy ethanol, ethoxy ethoxy ethanol and propylene glycol monomethyl ether; ester-based organic solvents such as ethyl acetate, butyl acetate, 3-methoxybutyl acetate, methyl methoxypropionate, ethyl ethoxypropionate and ethyl lactate; ketone-based organic solvents such as acetone, methyl isobutyl ketone, cyclohexanone and methyl ethyl ketone; ether alcohol acetate-based organic solvents such as methoxy ethyl acetate, methoxy propyl acetate, methoxy butyl acetate, ethoxy ethyl acetate, ethyl cellosolve acetate, methoxy ethoxy ethyl acetate, ethoxy ethoxy ethyl acetate and propylene glycol monomethyl ether acetate; ether-based organic solvents such as diethyl ether, ethylene glycol dimethyl ether, diethylene glycol dimethyl ether, diethylene glycol methyl ethyl ether and tetrahydrofuran; aprotic amide-based organic solvents such as N,N-dimethylformamide, N, N-dimethylacetamide and N-methylpyrrolidone; lactone-based organic solvents such as γ-butyrolactone; unsaturated hydrocarbon-based organic solvents such as benzene, toluene, xylene and naphthalene; and saturated hydrocarbon-based organic solvents such as n-heptane, n-hexane and n-octane.

Of them, the following are preferably used: ether alcohol-based organic solvents such as propylene glycol monomethyl ether; ether alcohol acetate-based organic solvents such as methoxy ethyl, acetate, ethoxy ethyl acetate, ethyl cellosolve acetate, methoxy ethoxy ethyl acetate, ethoxy ethoxy ethyl acetate and propylene glycol monomethyl ether acetate; ether-based organic solvents such as ethylene glycol dimethyl ether, diethylene glycol dimethyl ether, diethylene glycol methyl ethyl ether and propylene glycol diethyl ether; and ester-based organic solvents such as 3-methoxybutyl acetate, methyl methoxypropionate, ethyl ethoxypropionate and ethyl lactate.

Of them, from the viewpoint of the solubility and coating properties of the dispersant, the following are particularly preferred as the organic solvent used in the present invention: MBA (3-methoxybutyl acetate), PGMEA (propylene glycol monomethyl ether acetate), DMDG (diethylene glycol dimethyl ether), diethylene glycol methyl ethyl ether, PGME (propylene glycol monomethyl ether) and mixtures thereof.

In the metal particle dispersion of the present invention, the content of the organic solvent is not particularly limited, as long as the components of the metal particle dispersion can be uniformly dissolved or dispersed. In the present invention, the solid content of the metal particle dispersion is preferably in a range of 5 to 95% by mass, more preferably in a range of 20 to 90% by mass. When the solid content is in the range, a viscosity suitable for coating can be obtained.
<Other Components>

As needed, the metal particle dispersion of the present invention can contain other components, as long as the effect of the present invention is not deteriorated.

Examples of such components include a complexing agent, an organic protective agent, a reducing agent, a surfactant for increasing wettability, a silane coupling agent for increasing adhesion, a defoaming agent, a cissing inhibitor, an antioxidant, an aggregation inhibitor and a viscosity modifier. Also, the metal particle dispersion of the present invention can contain other dispersant, as long as the effect of the present invention is not deteriorated.
<Method for Producing a Metal Particle Dispersion>

In the present invention, the method for producing a metal particle dispersion is not particularly limited, as long as it is a method that is able to sufficiently disperse metal particles, and the method can be appropriately selected from conventionally known methods. In particular, for example, a metal particle dispersion can be prepared by mixing the dispersant with the solvent, stirring the mixture to prepare a dispersant solution, mixing metal particles and, as needed, other components with the dispersant solution, and then dispersing the mixture with a conventionally known stirrer or disperser.

Examples of the disperser used to disperse the mixture include a ultrasonic disperser, roller mills such as a two roller mill and a three roller mill, an attritor, a banbury mixer, a paint shaker, a kneader, a homogenizer, a ball mill, a sand mill and a bead mill.
[Method for Producing an Electroconductive Substrate]

The method for producing an electroconductive substrate according to the present invention comprises the steps of: forming a coating film by applying, onto a base material, a coating solution which contains a metal particle dispersion for electroconductive substrates, comprising metal particles, a dispersant and an organic solvent, wherein the dispersant is a graft copolymer having a constitutional unit represented by the following general formula (I) and a constitutional unit represented by the following general formula (II), and baking the coating film:

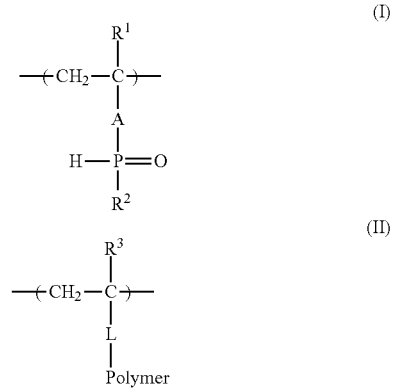

The symbol shown in the general formulae (I) and (II) are as described above.

According to the method for producing an electroconductive substrate according to the present invention, the remaining of organic components after sintering is inhibited, and an electroconductive substrate with excellent electroconductivity is obtained.

The method for producing an electroconductive substrate according to the present invention comprises at least the step of forming a coating film and the step of baking the coating film. As needed, the method can further comprise other steps, as long as the effect of the present invention is not deteriorated.

Hereinafter, the steps of the electroconductive substrate production method of the present invention will be described in order.
<The Step of Forming a Coating Film by Applying, onto a Base Material, a Coating Solution which Contains a Metal Particle Dispersion for Electroconductive Substrates>

This is a step of forming a coating film by applying, onto a base material, a coating solution which contains a metal particle dispersion for electroconductive substrates. Hereinafter, this step will be described in detail. The components of the metal particle dispersion for electroconductive substrates will not be described here, since they can be the same as those described above in the description of the metal particle dispersion for electroconductive substrates according to the present invention.
(Coating Solution which Contains a Metal, Particle Dispersion for Electroconductive Substrates)

As the coating solution containing a metal particle dispersion for electroconductive substrates, the metal particle dispersion for electroconductive substrates according to the present invention can be used as it is, or it can be mixed with an organic solvent and other components as needed and used as the coating solution.

As the organic solvent and other components, for example, the organic solvent described above in the description of the metal particle dispersion for electroconductive substrates according to the present invention, a surfactant, a silane coupling agent, a defoaming agent, a cissing inhibitor, an antioxidant, an aggregation inhibitor and a viscosity modifier can be used. In addition, a resin binder such as an acrylic resin binder or a polyester resin binder can be added from the viewpoint of film-forming properties, printing properties and dispersibility, as long as the effect of the present invention is not deteriorated.
(Base Material)

The base material used in the present invention can be appropriately selected from base materials used for electroconductive substrates, depending on the intended use. For example, glasses such as soda lime glass, alkali-free glass, borosilicate glass, high strain point glass and quartz glass, and inorganic materials such as alumina and silica can be used. Also, polymer materials and paper can be used. The metal particle dispersion for electroconductive substrates according to the present invention is able to form a metal film with excellent electroconductivity, even when it is baked at a lower temperature than ever before. Therefore, the metal particle dispersion of the present invention is applicable to soda lime glass and polymer materials, which have been difficult to use, and it is very useful in that it is applicable to resin films.

Examples of the resin films include films of polyimide, polyamide, polyamideimide, polyethylene terephthalate (PET), polyethylene naphtha late (PEN), polyphenylene sulfide, polyether ether ketone, polyethersulfone, polycarbonate, polyetherimide, epoxy resin, phenolic resin, glass-epoxy resin, polyphenylene ether, acrylic resin, polyolefins such as polyethylene and polypropylene, polycycloolefins such as polynorbonene, and liquid crystal polymer compounds.

In the case of forming a coating film of the coating solution containing the metal particle dispersion in a pattern, a treatment for controlling the pattern shape or for imparting adhesion between the coating film and the base material can be carried out on the base material surface. The method for treating the base material surface can be appropriately selected from conventionally known methods. Concrete examples thereof include dry treatments such as a corona treatment, a UV treatment, a vacuum ultraviolet lamp treatment and a plasma treatment; a chemical treatment using an amine-based silane coupling agent, an imidazole-based silane coupling agent, a titanate coupling agent or an aluminum coupling agent; treatments for forming a porous film such as a porous silica film or a cellulose-based receptive layer; and treatments for forming a resin layer such as an active energy ray-curable resin layer, a thermosetting resin layer or a thermoplastic resin layer. By imparting liquid repellency to the base material surface by the treatment, when the coating film of the coating solution containing the metal particle dispersion is formed in a pattern on the base material, the wetting and spreading of the coating solution on the base material surface can be inhibited, so that a highly precise pattern can be formed. Also, by forming an ink receptive layer such as a porous film on the base material surface, the solvent component penetrates into the layer and makes it possible to form a highly-precise pattern. To the contrary, by imparting lyophilic properties to the base material surface, the coating properties can be improved on the base material. These base material surface treatments can be appropriately selected and used depending on the intended use or purpose.

The form of the base material can be appropriately determined depending on the intended use. The base material can be in a flat plate form or a curved form. In general, the base material is in a flat plate form. In the case of using the base material in a flat plate form, the thickness of the base material can be appropriately determined depending on the intended use, and it can be about 10 µm to 1 mm, for example.

(Coating Method)

The method of applying the coating solution onto the base material can be appropriately selected from conventionally known methods. For example, there may be mentioned methods such as gravure printing, gravure offset printing, reverse offset printing, screen printing, spray coating, spin coating, comma coating, bar coating, knife coating, slot die coating, offset printing, flexographic printing, inkjet printing and dispenser printing. Of them, from the point of view that fine patterning can be carried out, preferred are gravure printing, gravure offset printing, reverse offset printing, flexographic printing, screen printing and inkjet printing. Particularly, because the metal particle dispersion used in the present invention has excellent dispersibility, it prevents discharge nozzles for inkjet from clogging and causing discharge bending. Therefore, the metal particle dispersion used in the present invention can also be suitably used for inkjet printing.

After printing, the coating solution on the base material can be dried by a general method. The thickness of the printed part after drying can be appropriately controlled by changing the coating amount or the average primary particle diameter of the metal particles. It can be appropriately adjusted depending on the intended use. The thickness is generally in a range of 0.01 to 50 µm, preferably in a range of 0.1 to 20 µm.

<The Step of Baking the Coating Film>

This is a step of forming a metal film by baking the coating film obtained in the above step.

The baking method can be appropriately selected from conventionally known baking methods. Concrete examples thereof include method such as heating with a baking furnace (oven), infrared heating, baking under a reducing gas atmosphere, baking by laser annealing, and microwave heating.

Even when baked at a low temperature or for a short time, the metal particle dispersion for electroconductive substrates according to the present invention is able to form a metal film with less organic components remaining therein. Therefore, it can be baked at lower temperature than conventional methods.

In the present invention, from the point of view that a metal film with less organic components remaining therein and with excellent electroconductivity can be obtained, the step of baking the coating film is preferably any one of a step of baking the coating film by surface wave plasma generated by applying microwave energy (hereinafter may be referred to as plasma baking) and a step of baking the coating film by irradiation with pulsed light (hereinafter may be referred to as pulsed light baking). By using these methods, heat damage to the base material can be decreased, and metal oxidation can be inhibited when baked. Also, this step has an advantage of increased productivity, because the coating film is baked for a short time.

In the present invention, because the dispersant has reducing properties, an excellent metal film can be formed even in the case of using a metal oxide and carrying out pulsed light baking in the atmosphere and under atmospheric pressure.

(Plasma Baking)

From the viewpoint of the electroconductivity of the thus-sintered film, the baking of the coating film with microwave surface wave plasma is preferably carried out under inert gas atmosphere or reducing gas atmosphere.

Especially in the present invention, it is preferable to generate the microwave surface wave plasma under reducing gas atmosphere, and it is more preferable to generate the microwave surface wave plasma under hydrogen gas atmosphere. Thereby, insulating oxides present on the metal particle surface are reduced and removed, and thus an electroconductive pattern with excellent electroconductivity is formed.

As the reducing gas of the reducing atmosphere, there may be mentioned gasses such as hydrogen gas, carbon monoxide gas and ammonia gas, and combinations thereof. From the viewpoint of producing less by-products, hydrogen gas is particularly preferred.

When the reducing gas is used in combination with an inert gas such as nitrogen, helium, argon, neon, krypton or xenon, there is such an effect that plasma can be easily generated.

Before the microwave surface wave plasma treatment, the coating film can be baked in the atmosphere or under an oxygen-containing atmosphere, at a temperature of about 50 to 200° C. and for about one minute to two hours, in order to remove organic matters (e.g., dispersant) contained in the coating film formed by applying the coating solution containing the metal, particle dispersion. This treatment can be carried out under reduced pressure. By this baking, the organic matters are oxidized, decomposed and removed to promote the sintering of the metal particles in the microwave surface wave plasma treatment.

The method for generating the microwave surface wave plasma can be appropriately selected from conventionally known methods. For example, there may be used an electrodeless plasma generating means in which microwave energy is supplied from the irradiation window of a baking treatment chamber in a reduced pressure state to generate surface wave plasma along the irradiation window in the baking treatment chamber.

A concrete example of the electrodeless plasma generating means is as follows: a microwave energy having a frequency of 2,450 MHz is supplied from the irradiation window of a baking treatment chamber to generate microwave surface wave plasma having an electron temperature of about 1 eV or less and an electron density of $1\times10^{11}$ to $1\times10^{13}$ cm$^{-3}$ in the treatment chamber.

A microwave energy is generally an electromagnetic wave having a frequency of 300 MHz to 3,000 GHz. For example, an electromagnetic wave at 2,450 MHz is used. At this time, when a magnetron is used as a microwave oscillator, it has a frequency range of 2,450 MHz/±50 MHz due to precision error, etc.

Such microwave surface wave plasma has properties of a high plasma density and a low electron temperature, so that it is able to bake the coating film at a low temperature and for a short time, and it is able to form a dense and smooth metal particle sintered film. In the case of using the microwave surface wave plasma, the treatment surface is irradiated with in-plane uniform density plasma. As a result, compared to other baking methods, a non-uniform film is less likely to be formed (e.g., in-plane partial baking of the particles is less likely to be promoted), and the particles can be prevented from growing, so that, a very dense, smooth film can be obtained. Also, it is not needed to provide an electrode in the in-plane treatment chamber, so that contamination of impurities derived from the electrode can be prevented, and also the treated material can be prevented from damage caused by an abnormal electrical discharge.

In addition, the microwave surface wave plasma has a low electron temperature, so that it has a low ability of etching the base material. Therefore, it is presumed that damage to the base material can be minimized.

(Pulsed Light Baking)

Pulsed light baking is a method of baking the coating film for a quite short time by irradiation with pulsed light.

In the present invention, pulsed light means a light with a relatively short emission time, and the light emission time is called pulse width. The light source of the pulsed light is not particularly limited, and examples thereof include a flash lamp filled with rare gas such as xenon and a laser. In particular, it is preferable to irradiate the coating film with a light with a continuous wavelength spectrum extending from the ultraviolet to the infrared. More specifically, it is preferable to use a xenon flash lamp. In the case of using such a light source, it is possible to obtain similar effect to those obtained by carrying out heating and UV irradiation at the same time, and it is also possible to bake the coating film for a quite short time. Also in the case of using such a light source, by controlling the pulse width and irradiation energy, it is possible to heat only the coating film of the coating solution containing the metal particle dispersion and the vicinity thereof, so that it is possible to curb the influence of the heat on the base material.

In the present invention, the pulse width of the pulsed light can be appropriately controlled. The pulse width is preferably set between 1 µs and 10,000 µs, more preferably in a range of 10 µs to 5,000 µs. The irradiation energy of the pulsed light is preferably 0.1 J/cm$^2$ to 100 J/cm$^2$, more preferably 0.5 J/cm$^2$ to 50 J/cm$^2$, per pulse irradiation.

In the pulsed light baking, the number of the pulsed light irradiation can be appropriately controlled, depending on the composition, thickness, area and so on of the coating film. The number of the pulsed light irradiation can be one time, or the irradiation can be repeated two or more times. The number of the pulsed light irradiation is preferably 1 to 100 times, more preferably 1 to 50 times. When the pulsed light irradiation is carried out several times, the interval of the pulsed light irradiation can be appropriately controlled. It is preferable to set the interval in a range of 1.0 µs to 2 seconds, and it is more preferable to set the interval in a range of 100 µs to 1 second.

By setting the pulsed light irradiation as above, the influence on the base material can be curbed, and the oxidation of the metal particles can be inhibited. Moreover, the dispersant contained in the metal particle dispersion can be easily detached or decomposed, and an electroconductive substrate with excellent electroconductivity can be obtained.

Such pulsed light baking can heat only the coating film of the coating solution containing the metal particle dispersion and the vicinity thereof, so that the coating film can be baked at a low temperature and for a short time, and a dense and smooth metal particle sintered film can be formed. In the pulsed light baking, the heating temperature and baking depth can be controlled by appropriately setting the pulse width and irradiation energy of the pulsed light. As a result, a non-uniform film is less likely to be formed, and the particles can be prevented from growing. Therefore, a very dense, smooth film can be obtained. Also, because the coating film can be baked for a quite short time, the oxidation of the metal particles can be inhibited, and a sintered film with excellent electroconductivity can be formed.

The pulsed light baking can be carried out in the atmosphere and under atmospheric pressure. It can be carried out under inert atmosphere, under reducing atmosphere or under reduced pressure. Also, the pulsed light baking can be carried out with heating the coating film.

The thickness of the thus-obtained metal film on the electroconductive substrate can be appropriately controlled depending on the intended use. The thickness is generally about 0.01 to 50 µm, preferably 0.05 to 30 µm, more preferably 0.1 to 20 µm.

The volume resistivity of the metal layer is preferably $1.0\times10^{-4}$ Ω·cm or less.

The production method of the present invention can be a method for producing an electroconductive substrate in a pattern, in which a coating film is formed by applying the coating solution containing the metal particle dispersion in a pattern onto the base material, and the coating film is baked to form a metal film in a pattern.

The electroconductive substrate obtained by the electroconductive substrate production method of the present invention is an electroconductive substrate which has succeeded in inhibiting the remaining of organic components therein after sintering, and which has excellent electroconductivity. Electronic members using such an electroconductive substrate can be effectively used in electromagnetic wave shielding films with low surface resistance, electroconductive films, flexible printed wiring boards, etc.

EXAMPLES

Hereinafter, the present invention will be described in detail, by way of examples. The scope of the present invention is not limited by the examples.

Synthesis Example 1. Production of Copper Particles

First, 64 g of copper(II) oxide and 5.1 g of gelatin, which functions as an organic protective agent, were added to 650 mL of pure water and mixed to prepare a mixed solution. The pH of the mixed solution was set to 10 by using 15% ammonia water. Then, the temperature of the mixed solution was increased from room temperature to 90° C. for 20 minutes. After increasing the temperature, with stirring the mixed solution, a solution obtained by mixing 6.4 g of 1% mercaptoacetic acid solution and 75 g of 80% hydrazine monohydrate, which function as a complexing agent, with 150 mL of pure water, was added to the mixed solution and reacted with the copper(II) oxide for one hour, thereby obtaining copper particles. The copper particles were observed with a scanning transmission electron microscope (STEM) and found to have an average primary particle diameter of 50 nm.

Synthesis Example 2. Synthesis of Phosphorus-Containing Monomer 1

First, 100.23 parts by mass of propylene glycol monomethyl ether acetate (PGMEA), 50.00 parts by mass of phenylphosphinic acid (manufactured by Tokyo Chemical Industry Co., Ltd.) and 0.13 part by mass of p-methoxyphenol were put in a reactor equipped with a cooling tube, an addition funnel, a mechanical stirrer and a digital thermometer, and heated to 100° C. with bubbling dry air thereinto. A mixed solution of 50.00 parts by mass of PGMEA and 50.02 parts by mass of glycidyl methacrylate was added thereto in a dropwise manner for 30 minutes. Then, the mixture was heated and stirred for one hour, thereby obtaining a 40.00% solution of the phosphorus-containing monomer 1 represented by the following chemical formula (1). By the $^1$H-NMR measurement, the disappearance of epoxy groups was confirmed. By the $^{31}$P-NMR measurement, the generation of phosphinic ester was confirmed.

Chemical Formula (1)

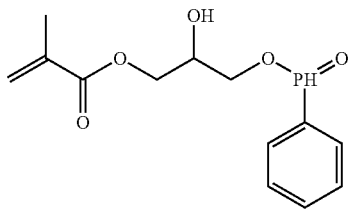

Synthesis Example 3. Synthesis of Phosphorus-Containing Monomer 2

First, 70.00 parts by mass of propylene glycol monomethyl ether acetate (PGMEA), 50.00 parts by mass of a hypophosphorous acid solution (manufactured by Wako) and 0.14 part by mass of p-methoxyphenol were put in a reactor equipped with a cooling tube, an addition funnel, a mechanical stirrer and a digital thermometer, and heated to 100° C. with bubbling dry air thereinto. A mixed solution of 48.48 parts by mass of PGMEA and 53.84 parts by mass of glycidyl methacrylate was added thereto in a dropwise manner for 30 minutes. Then, the mixture was heated and stirred for one hour, thereby obtaining a 35.50% solution of the phosphorus-containing monomer 2 represented by the following chemical formula (2). By the $^1$H-NMR measurement, the disappearance of epoxy groups was confirmed. By the $^{31}$P-NMR measurement, the generation of phosphinic ester was confirmed.

Chemical Formula (2)

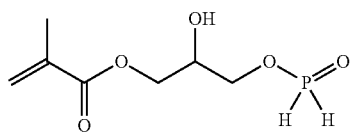

Comparative Synthesis Example 1. Synthesis of Phosphorus-Containing Monomer 3

First, 142.61 parts by mass of diethylene glycol ethyl methyl ether (EMDG), 50.00 parts by mass of phenylphosphonic acid (manufactured by Nissan Chemical Industries, Ltd.) and 0.10 part by mass of p-methoxyphenol were put in a reactor equipped with a cooling tube, an addition funnel, a nitrogen inlet, a mechanical stirrer and a digital thermometer, and heated to 120° C. with stirring under a nitrogen flow. Then, 44.96 parts by mass of glycidyl methacrylate was added thereto in a dropwise manner for 30 minutes. Then, the mixture was heated and stirred for two hours, thereby obtaining a 40.0% by mass solution of the phosphorus-containing monomer 3 having no phosphine (P—H) site. By the $^1$H-NMR measurement, the disappearance of epoxy groups was confirmed. By the $^{31}$P-NMR measurement, the generation of phosphonate ester was confirmed.

Synthesis Example 4. Synthesis of Macromonomer MM-1

First, 100.0 parts by mass of PGMEA was put in a reactor equipped with a cooling tube, an addition funnel, a nitrogen inlet, a mechanical stirrer and a digital thermometer, and heated to 90° C. with stirring under a nitrogen flow. A mixed solution of 50.0 parts by mass of methyl methacrylate, 15.0 parts by mass of butyl methacrylate, 15.0 parts by mass of benzyl methacrylate, 20.0 parts by mass of ethoxyethyl methacrylate, 4.0 parts by mass of 2-mercaptoethanol and 1.3 parts by mass of PERBUTYL O (manufactured by NOF Corporation) was added thereto in a dropwise manner for 1.5 hours, and the mixture was reacted for 3 hours. Next, the nitrogen flow was stopped and the reaction solution was cooled to 80° C. To the cooled reaction solution, 8.74 parts by mass of Karenz MOI (manufactured by Showa Denko K. K.), 0.125 part by mass of dibutyltin dilaurate, 0.125 part by mass of p-methoxyphenol and 10 parts by mass of PGMEA were added and stirred for 3 hours, thereby obtaining a 49.8% by mass solution of the macromonomer MM-1. The thus-obtained macromonomer MM-1 was confirmed by GPC (gel permeation chromatography) under the condition of addition of N-methylpyrrolidone and 0.01 mol/L lithium bromide/polystyrene standard. As a result, the macromonomer MM-1 was found to have a mass average molecular weight (Mw) of 3,657, a number average molecular weight (Mn) of 1,772 and a molecular weight distribution (Mw/Mn) of 2.06.

Example 1. Synthesis of Graft Copolymer GP-1

First, 85.0 parts by mass of PGMEA was put in a reactor equipped with a cooling tube, an addition funnel, a nitrogen inlet, a mechanical stirrer and a digital thermometer, and heated to 85° C. with stirring under a nitrogen flow. A mixed solution of 8.33 parts by mass of 1-vinyl-2-pyrrolidone, 20.82 parts by mass of the phosphorus-containing monomer 1 of Synthesis Example 2, 66.93 parts by mass of the macromonomer MM-1 solution of Synthesis Example 4 (active solid content 33.33 parts by mass), 1.25 parts by mass of n-dodecyl mercaptan, 20.0 parts by mass of PGMEA and 0.5 part by mass of azobisisobutyronitrile (AIBN) was added thereto in a dropwise manner for 1.5 hours. The mixture was heated and stirred for 3 hours. Then, a mixed solution of 0.10 part by mass of AIBN and 10.0 parts by mass of PGMEA was added thereto in a dropwise manner for 10 minutes, and the mixture was further heated at the same temperature for one hour, thereby obtaining a 24.8% by mass solution of the graft copolymer GP-1. As a result of GPC measurement, the thus-obtained graft copolymer GP-1 was found to have a mass average molecular weight (Mw) of 10,235, a number average molecular weight (Mn) of 4,264 and a molecular weight distribution (Mw/Mn) of 2.40.

Example 2. Synthesis of Graft Copolymer GP-2

First, 85.0 parts by mass of PGMEA was put in a reactor equipped with a cooling tube, an addition funnel, a nitrogen inlet, a mechanical stirrer and a digital thermometer, and heated to 85° C. with stirring under a nitrogen flow. A mixed solution of 41.63 parts by mass of the phosphorus-containing monomer 1 of Synthesis Example 2, 66.93 parts by mass of the macromonomer MM-1 solution of Synthesis Example 4 (active solid content 33.33 parts by mass), 1.25 parts by mass of n-dodecyl mercaptan, 20.0 parts by mass of PGMEA and 0.5 part by mass of AIBN was added thereto in a dropwise manner for 1.5 hours. The mixture was heated and stirred for 3 hours. Then, a mixed solution of 0.10 part by mass of AIBN and 10.0 parts by mass of PGMEA was added thereto in a dropwise manner for 10 minutes, and the mixture was further heated at the same temperature for one hour, thereby obtaining a 23.5% by mass solution of the graft copolymer GP-2. As a result of GPC measurement, the thus-obtained graft copolymer GP-2 was found to have a mass average molecular weight (Mw) of 11,050, a number average molecular weight (Mn) of 4,702 and a molecular weight distribution (Mw/Mn) of 2.35.

Example 3. Synthesis of Graft Copolymer GP-3

First, 85.0 parts by mass of PGMEA was put in a reactor equipped with a cooling tube, an addition funnel, a nitrogen inlet, a mechanical stirrer and a digital thermometer, and heated to 85° C. with stirring under a nitrogen flow. A mixed solution of 8.33 parts by mass of 1-vinyl-2-pyrrolidone, 23.46 parts by mass of the phosphorus-containing monomer 2 of Synthesis Example 3, 66.93 parts by mass of the macromonomer MM-1 solution of Synthesis Example 4 (active solid content 33.33 parts by mass), 1.25 parts by mass of n-dodecyl mercaptan, 20.0 parts by mass of PGMEA and 0.5 part by mass of azobisisobutyronitrile (AIBN) was added thereto in a dropwise manner for 1.5 hours. The mixture was heated and stirred for 3 hours. Then, a mixed solution of 0.10 part by mass of AIBN and 10.0 parts by mass of PGMEA was added thereto in a dropwise manner for 10 minutes, and the mixture was further heated at the same temperature for one hour, thereby obtaining a 24.00% by mass solution of the graft copolymer GP-3. As a result of GPC measurement, the thus-obtained graft copolymer GP-3 was found to have a mass average molecular weight (Mw) of 22,500, a number average molecular weight (Mn) of 4,800 and a molecular weight distribution (Mw/Mn) of 2.60.

Example 4. Synthesis of Graft Copolymer GP-4

First, 85.0 parts by mass of PGMEA was put in a reactor equipped with a cooling tube, an addition funnel, a nitrogen inlet, a mechanical stirrer and a digital thermometer, and heated to 85° C. with stirring under a nitrogen flow. A mixed solution of 46.92 parts by mass of the phosphorus-containing monomer 2 of Synthesis Example 3, 66.93 parts by mass of the macromonomer MM-1 solution of Synthesis Example 4 (active solid content 33.33 parts by mass), 1.25 parts by mass of n-dodecyl mercaptan, 20.0 parts by mass of PGMEA and 0.5 part by mass of AIBN was added thereto in a dropwise manner for 1.5 hours. The mixture was heated and stirred for 3 hours. Then, a mixed solution of 0.10 part by mass of AIBN and 10.0 parts by mass of PGMEA was added thereto in a dropwise manner for 10 minutes, and the mixture was further heated at the same temperature for one hour, thereby obtaining a 22.40% by mass solution of the graft copolymer GP-4. As a result of GPC measurement, the thus-obtained graft copolymer GP-4 was found to have a mass average molecular weight (Mw) of 10,420, a number average molecular weight (Mn) of 4,220 and a molecular weight distribution (Mw/Mn) of 2.47.

Comparative Example 1. Synthesis of Graft Copolymer GP-5

A 24.8% by mass solution of the graft copolymer GP-5 was obtained in the same manner as Example 1, except that 20.82 parts by mass of the phosphorus-containing monomer 3 having no phosphine (P—H) site of Comparative Synthesis Example 1 was used in place of the phosphorus-containing monomer 1 of Synthesis Example 2. As a result of GPC measurement, the thus-obtained graft copolymer GP-5 was found to have a mass average molecular weight (Mw) of 11,030, a number average molecular weight (Mn) of 4,300 and a molecular weight distribution (Mw/Mn) of 2.57.

Example 5. Preparation of Metal Particle Dispersion

First, 6.0 parts by mass of the copper particles obtained in Synthesis Example 1, 1.81 parts by mass of the graft copolymer GP-1 obtained in Example 1 and 7.19 parts by mass of PGMEA were mixed. Using a paint shaker (manufactured by Asada Iron Works Co., Ltd.), the mixture was subjected to pre-dispersion for 1 hour with 2 mm zirconia beads. Then, the mixture was further subjected to main dispersion for 4 hours with 0.1 mm zirconia beads, thereby obtaining a metal particle dispersion 1.

Example 6. Preparation of Metal Particle Dispersion

A metal particle dispersion 2 was obtained in the same manner as Example 5, except that 1.91 parts by mass of the graft copolymer GP-2 of Example 2 was used in place of the graft copolymer GP-1.

Example 7. Preparation of Metal Particle Dispersion

A metal particle dispersion 3 was obtained in the same manner as Example 5, except that 3.88 parts by mass of the graft copolymer GP-3 of Example 3 was used in place of the graft copolymer GP-1.

Example 8. Preparation of Metal Particle Dispersion

A metal particle dispersion 4 was obtained in the same manner as Example 5, except that 2.01 parts by mass of the graft copolymer GP-4 of Example 4 was used in place of the graft copolymer GP-1.

Example 9. Preparation of Metal Particle Dispersion

A metal particle dispersion 5 was obtained in the same manner as Example 5, except that 6.0 parts by mass of core-shell particles (core: copper, shell: copper oxide) (manufactured by QSI-Nano, average primary particle diameter 35 nm) were used in place of the copper particles.

Example 10. Preparation of Metal Particle Dispersion

A metal particle dispersion 6 was obtained in the same manner as Example 5, except that 6.0 parts by mass of core-shell particles (core: copper, shell: copper oxide) (manufactured by QSI-Nano, average primary particle diameter 35 nm) were used in place of the copper particles, and 1.91 parts by mass of the graft copolymer GP-2 of Example 2 was used in place of the graft copolymer GP-1.

Comparative Example 2. Preparation of Comparative Metal Particle Dispersion

A comparative metal particle dispersion 1 was obtained in the same manner as Example 5, except that 0.45 part by mass (solid content equivalent) of polyvinylpyrrolidone (mass average molecular weight 10,000, K-15 manufactured by Nippon Shokubai Co., Ltd.) was used in place of the graft copolymer GP-1, and 8.55 parts by mass of IPA was used in place of the PGMEA.

Comparative Example 3. Preparation of Comparative Metal Particle Dispersion

A comparative metal particle dispersion 2 was obtained in the same manner as Example 5, except that 0.45 part by mass (solid content equivalent) of polyvinylpyrrolidone (mass average molecular weight 10,000, K-15 manufactured by Nippon Shokubai Co., Ltd.) was used in place of the graft copolymer GP-1.

Comparative Example 4. Preparation of Comparative Metal Particle Dispersion

A comparative metal particle dispersion 3 was obtained in the same manner as Example 5, except that 1.81 parts by mass of the graft copolymer GP-5 of Comparative Example 1 was used in place of the graft copolymer GP-1.

Comparative Example 5. Preparation of Comparative Metal Particle Dispersion

A comparative metal particle dispersion 4 was obtained in the same manner as Comparative Example 2, except that 6.0 parts by mass of core-shell particles (core: copper, shell: copper oxide) (manufactured by QSI-Nano, average primary particle diameter 35 nm) were used in place of the copper particles.

Comparative Example 6. Preparation of Comparative Metal Particle Dispersion

A comparative metal particle dispersion 5 was obtained in the same manner as Comparative Example 3, except that 6.0 parts by mass of core-shell particles (core: copper, shell: copper oxide) (manufactured by QSI-Nano, average primary particle diameter 35 nm) were used in place of the copper particles.

(Evaluation)

(1) Evaluation of the Dispersibility of Metal Particle Dispersion

To evaluate the dispersibility of the metal particles, the average dispersed particle diameter of the metal particles contained in each of the metal particle dispersions obtained in Examples and Comparative Examples, was measured. To measure the average dispersed particle diameter, "Microtrac Particle Size Distribution Analyzer UPA-EX150" (manufactured by Nikkiso Co., Ltd.) was used.

Each of the metal particle dispersions obtained in Examples and Comparative Examples was left to stand for one week in a refrigerator (5° C.). Then, each metal particle dispersion was visually observed to check the presence of precipitates.

[Criterion for Evaluation of the Dispersibility]

o: The average dispersed particle diameter is 150 nm or less and no precipitates are found.

x: The average dispersed particle diameter is more than 150 nm and precipitates are found.

The evaluation results of the dispersibility are shown in Table 1.

(2) Production of Electroconductive Substrate

Each of the metal particle dispersions obtained in Examples and Comparative Examples was applied onto a polyimide film (product name: Kapton 300H, manufactured by: Toray-DuPont Co., Ltd., thickness 75 urn) with a wire bar and dried at 100° C. for 1.5 minutes, thereby obtaining a coating film having a thickness of 1 μm.

Using a pulsed xenon lamp (SINTERON 2000 manufactured by Xenon Corporation), each coating film was irradiated once with pulsed light at a pulse width of 500 μs and an applied voltage of 3.8 kV, thereby producing an electroconductive substrate.

<Evaluation of Coating Properties>

Coating films of the metal particle dispersions obtained in Examples and Comparative Examples were formed. Before baking the coating films, they were evaluated for their coating properties by visually observing the film quality of the coating films of the metal particle dispersions.

[Criterion for Evaluation of the Coating Properties]

o: No cissing is found and the coating film is uniform.

x: Cissing is found and the coating film is not uniform.

<Evaluation of Electroconductivity>

The electroconductive substrates obtained by the pulsed light baking were evaluated for their electroconductivity.

Using a surface resistance meter ("Loresta GP" manufactured by Dia Instruments Co., Ltd., PSP type probe), the metal film on each of the electroconductive substrates of Examples and Comparative Examples was brought into contact with the four-point probe to measure the sheet surface resistance by the four-probe method. The results are shown in Table 1. As the sheet surface resistance gets smaller, the electroconductivity gets better. The upper measurement limit of the sheet surface resistance by this measurement method was $10^8 \Omega/\square$.

TABLE 1

| | Metal particles | Dispersant | Solvent | Metal particles (% by mass) | Dispersant (% by mass) | Average dispersed particle diameter (nm) | Dispersibility | Coating properties | Electroconductivity ($\Omega/\square$) |
|---|---|---|---|---|---|---|---|---|---|
| Example 5 | Cu | GP-1 | PGMEA | 40 | 3 | 20.9 | ○ | ○ | 0.19 |
| Example 6 | Cu | GP-2 | PGMEA | 40 | 3 | 29.3 | ○ | ○ | 0.27 |
| Example 7 | Cu | GP-3 | PGMEA | 40 | 3 | 97.0 | ○ | ○ | 0.34 |
| Example 8 | Cu | GP-4 | PGMEA | 40 | 3 | 95.2 | ○ | ○ | 0.18 |
| Example 9 | Core-shell | GP-1 | PGMEA | 40 | 3 | 94.7 | ○ | ○ | 0.51 |
| Example 10 | Core-shell | GP-2 | PGMEA | 40 | 3 | 128.9 | ○ | ○ | 0.35 |
| Comparative Example 3 | Cu | PVP | IPA | 40 | 3 | 300 | X | X | 0.88 |
| Comparative Example 4 | Cu | PVP | PGMEA | 40 | 3 | — | X | X | — |
| Comparative Example 5 | Cu | GP-5 | PGMEA | 40 | 3 | 144.0 | ○ | ○ | 1.10 |
| Comparative Example 6 | Core-shell | PVP | IPA | 40 | 3 | 350 | X | X | 0.67 |
| Comparative Example 7 | Core-shell | PVP | PGMEA | 40 | 3 | — | X | X | — |

CONCLUSION

The metal particle dispersions of Examples 5 to 10 comprising any one of the graft copolymers GP-1 to GP-4 obtained in Examples 1 to 4, respectively, graft copolymers having the constitutional unit represented by the general formula (I) and the constitutional unit represented by the general formula (II), produced no precipitates and have excellent dispersibility. The coating films of the metal particle dispersions of Examples 5 to 10 could form uniform coating films with no cissing. Also, the electroconductive substrates formed by using the metal particle dispersions of Examples 5 to 10 have excellent electroconductivity. As shown by Comparative Examples 3 and 6, in the case of using polyvinylpyrrolidone as the dispersant, the metal particles could not be dispersed in the PGMEA. As shown by Comparative Examples 2 and 5, by using IPA (aqueous solvent) as the solvent, the metal particles can be dispersed with polyvinylpyrrolidone. However, the metal particle dispersions of Comparative Examples 2 and 5 have large average dispersed particle diameters and produced precipitates. As shown by Comparative Examples 2 and 5, the metal particle dispersions using the aqueous solvent caused cissing and could not be applied uniformly. Also, the electroconductive substrates obtained by using such metal particle dispersions of Comparative Examples 2 and 5 are inferior to Examples in electroconductivity.

The metal particle dispersion of Comparative Example 4 produced no precipitates, has excellent dispersibility and is also excellent in coating properties. However, the electroconductive substrate of Comparative Example 4 is inferior to Examples 5 to 1.0 in electroconductivity. Since the dispersant of Comparative Example 4 has no phosphine (P—H) site, it is presumed that it has weak reducing properties and is insufficient in inhibiting the oxidation of the metal particles. Meanwhile, the graft copolymers GP-1 to GP-4 obtained in Examples 1 to 4, the graft copolymers having the constitutional unit represented by the general formula (I) and the constitutional unit represented by the general formula (II), have the phosphine (P—H) site which has reducing properties. Therefore, it is presumed that the oxidation of the adsorbed metal particles was inhibited, and excellent electroconductivity was obtained. From the results of Examples 9 and 10, it is clear that even in the case of using core-shell particles having a copper oxide surface, excellent electroconductivity is obtained by using the dispersant of the present invention.

REFERENCE SIGNS LIST

1. Base material
2. Metal film
100. Substrate

The invention claimed is:
1. A dispersant comprising a graft copolymer comprising a constitutional unit represented by the following general formula (I) and a constitutional unit represented by the following general formula (II):

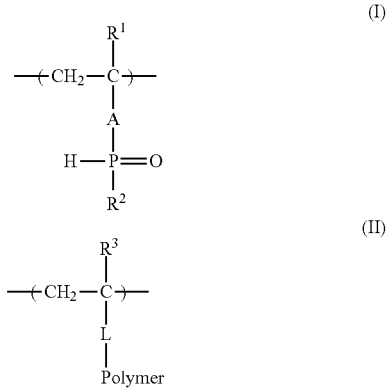

wherein "A" is a direct bond or a divalent linking group, and the divalent linking group as "A" is at least one selected from the group consisting of a linear, branched or cyclic alkylene group, a linear, branched or cyclic alkylene group comprising a hydroxyl group, an arylene group, a —CONH— group, a —COO— group, a —NHCOO— group, an ether group (—O— group), a thioether group (—S— group) and combinations thereof; $R^1$ is a hydrogen atom or a methyl group; $R^2$ is a hydrogen atom, a hydrocarbon group optionally comprising a substituent group, or a monovalent group represented by —[CH($R^4$)—CH($R^5$)—O]$_s$—$R^6$, —[(CH$_2$)$_t$—O]$_u$—$R^6$ or —O—$R^7$; $R^7$ is a hydrocarbon group optionally comprising a substituent group, or a monovalent group represented by —[CH($R^4$)—CH($R^5$)—O]$_s$—$R^6$, —[(CH$_2$)$_t$—O]$_u$—$R^6$, —C($R^8$)($R^9$)—C($R^{10}$)($R^{11}$)—OH or —CH$_2$—C($R^{12}$)($R^{13}$)—CH$_2$—OH;

$R^4$ and $R^5$ are each independently a hydrogen atom or a methyl group; $R^6$ is a hydrogen atom, a hydrocarbon group optionally comprising a substituent group, or a monovalent group represented by —CHO, —CH$_2$CHO, —CO—CH=CH$_2$, —CO—C(CH$_3$)=CH$_2$ or —CH$_2$COOR$^{14}$; $R^{14}$ is a hydrogen atom or an alkyl group comprising 1 to 5 carbon atoms; $R^8$, $R^9$, $R^{10}$, $R^{11}$, $R^{12}$ and $R^{13}$ are each independently a hydrogen atom, a hydrocarbon group optionally comprising a substituent group, or a group in which hydrocarbon groups optionally comprising a substituent group, are bound by at least one of an ether bond and an ester bond, and $R^8$ and $R^{10}$ can be bound to each other to form a cyclic structure; when the cyclic structure is formed, the cyclic structure can comprise a substituent group $R^{15}$, and $R^{15}$ is a hydrogen atom, a hydrocarbon group optionally comprising a substituent group, or a group in which hydrocarbon groups optionally comprising a substituent group, are bound by at least one of an ether bond and an ester bond;

the substituent group in $R^2$, $R^6$, $R^7$, $R^8$, $R^9$, $R^{10}$, $R^{11}$, $R^{12}$, $R^{13}$ and $R^{15}$ is at least one selected from the group consisting of a nitro group and a halogen atom, and when $R^2$, $R^6$, $R^7$, $R^8$, $R^9$, $R^{10}$, $R^{11}$, $R^{12}$, $R^{13}$ and $R^{15}$ are each a group comprising an aromatic ring, the aromatic ring can comprise a substituent group of an alkyl or alkenyl group;

s is an integer of 1 to 18; t is an integer of 1 to 5; and u is an integer of 1 to 18;

wherein "L" is a direct bond or a divalent linking group, and the divalent linking group as "L" is at least one selected from the group consisting of a linear, branched or cyclic alkylene group, a linear, branched or cyclic alkylene group comprising a hydroxyl group, an arylene group, a —CONH— group, a —COO— group, a —NHCOO— group, an ether group (—O— group), a thioether group (—S— group) and combinations thereof; $R^3$ is a hydrogen atom or a methyl group; "Polymer" is a polymer chain comprising at least one constitutional unit represented by the following general formula (III) or (IV):

(III)

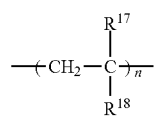

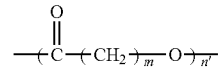

wherein $R^{17}$ is a hydrogen atom or a methyl group; $R^{18}$ is a hydrocarbon group optionally comprising a substituent group, a cyano group or a monovalent group represented by —[CH($R^{19}$)—CH($R^{20}$)—O]$_x$—$R^{21}$, —[(CH$_2$)$_y$—O]$_z$—$R^{21}$, —[CO—(CH$_2$)$_y$—O]$_z$—$R^{21}$, —CO—O—$R^{22}$ or —O—CO—$R^{23}$; $R^{19}$ and $R^{20}$ are each independently a hydrogen atom or a methyl group;

$R^{21}$ is a hydrogen atom, a hydrocarbon group optionally comprising a substituent group, or a monovalent group represented by —CHO, —CH$_2$CHO or —CH$_2$COOR$^{24}$; $R^{22}$ is a hydrocarbon group optionally comprising a substituent group, a cyano group or a monovalent group represented by —[CH($R^{19}$)—CH($R^{20}$)—O]$_x$—$R^{21}$, —[(CH$_2$)$_y$—O]$_z$—$R^{21}$ or —[CO—(CH$_2$)$_y$—O]$_z$—$R^{21}$; $R^{23}$ is an alkyl group comprising 1 to 18 carbon atoms and optionally comprising a substituent group; $R^{24}$ is a hydrogen atom or an alkyl group comprising 1 to 5 carbon atoms;

the substituent group in $R^{18}$, $R^{21}$, $R^{22}$ and $R^{23}$ is at least one selected from the group consisting of a nitro group, a halogen atom, an alkoxy group, a hydroxyl group, a carboxyl group, an amino group, an epoxy group and an isocyanate group, and when $R^{18}$, $R^{21}$, $R^{22}$ and $R^{23}$ are each a group comprising an aromatic ring, the aromatic ring can comprise a substituent group of an alkyl or alkenyl group;

m is an integer of 1 to 5; n and n' are each an integer of 5 to 200; x is an integer of 1 to 18; y is an integer of 1 to 5; and z is an integer of 1 to 18.

2. The dispersant according to claim 1, wherein the graft copolymer further comprises a constitutional unit represented by the following general formula (V):

(V)

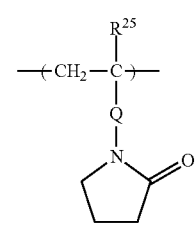

wherein $R^{25}$ is a hydrogen atom or a methyl group, and "Q" is a direct bond or a divalent linking group, and the divalent linking group as "Q" is at least one selected from the group consisting of an alkylene group comprising 1 to 10 carbon atoms, an arylene group, a —CONH— group, a —COO— group, an ether group comprising 1 to 10 carbon atoms (—R'—OR"— wherein R' and R" are each independently an alkylene group) and combinations thereof.

3. A metal particle dispersion for electroconductive substrates, comprising metal particles, a dispersant and an organic solvent, wherein the dispersant is a graft copolymer comprising a constitutional unit represented by the following general formula (I) and a constitutional unit represented by the following general formula (II):

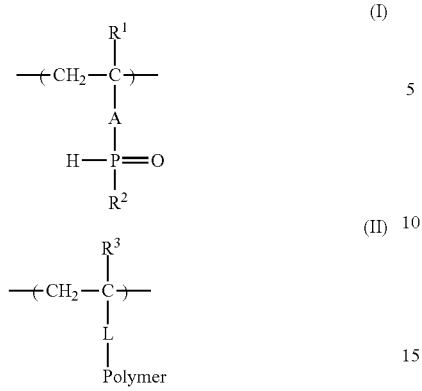

(I)

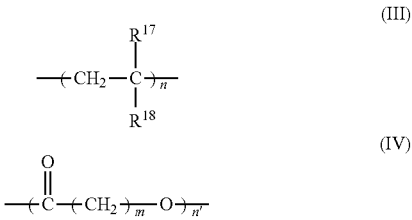

(II)

wherein "A" is a direct bond or a divalent linking group, and the divalent linking group as "A" is at least one selected from the group consisting of a linear, branched or cyclic alkylene group, a linear, branched or cyclic alkylene group comprising a hydroxyl group, an arylene group, a —CONH— group, a —COO— group, a —NHCOO— group, an ether group (—O— group), a thioether group (—S— group) and combinations thereof; $R^1$ is a hydrogen atom or a methyl group; $R^2$ is a hydrogen atom, a hydrocarbon group optionally comprising a substituent group, or a monovalent group represented by —[CH($R^4$)—CH($R^5$)—O]$_s$—$R^6$, —[(CH$_2$)$_t$—O]$_u$—$R^6$ or —O—$R^7$; $R^7$ is a hydrocarbon group optionally comprising a substituent group, or a monovalent group represented by —[CH($R^4$)—CH($R^5$)—O]$_s$—$R^6$, —[(CH$_2$)$_t$—O]$_u$—$R^6$, —C($R^8$)($R^9$)—C($R^{10}$)($R^{11}$)—OH or —CH$_2$—C($R^{12}$)($R^{13}$)—CH$_2$—OH;

$R^4$ and $R^5$ are each independently a hydrogen atom or a methyl group; $R^6$ is a hydrogen atom, a hydrocarbon group optionally comprising a substituent group, or a monovalent group represented by —CHO, —CH$_2$CHO, —CO—CH=CH$_2$, —CO—C(CH$_3$)=CH$_2$ or —CH$_2$COO$R^{14}$; $R^{14}$ is a hydrogen atom or an alkyl group comprising 1 to 5 carbon atoms; $R^8$, $R^9$, $R^{10}$, $R^{11}$, $R^{12}$ and $R^{13}$ are each independently a hydrogen atom, a hydrocarbon group optionally comprising a substituent group, or a group in which hydrocarbon groups optionally comprising a substituent group, are bound by at least one of an ether bond and an ester bond, and $R^8$ and $R^{10}$ can be bound to each other to form a cyclic structure; when the cyclic structure is formed, the cyclic structure can comprise a substituent group $R^{15}$, and $R^{15}$ is a hydrogen atom, a hydrocarbon group optionally comprising a substituent group, or a group in which hydrocarbon groups optionally comprising a substituent group, are bound by at least one of an ether bond and an ester bond;

the substituent group in $R^2$, $R^6$, $R^7$, $R^8$, $R^9$, $R^{10}$, $R^{11}$, $R^{12}$, $R^{13}$ and $R^{15}$ is at least one selected from the group consisting of a nitro group and a halogen atom, and when $R^2$, $R^6$, $R^7$, $R^8$, $R^9$, $R^{10}$, $R^{11}$, $R^{12}$, $R^{13}$ and $R^{15}$ are each a group comprising an aromatic ring, the aromatic ring can comprise a substituent group of an alkyl or alkenyl group;

s is an integer of 1 to 18; t is an integer of 1 to 5; and u is an integer of 1 to 18;

wherein "L" is a direct bond or a divalent linking group, and the divalent linking group as "L" is at least one selected from the group consisting of a linear, branched or cyclic alkylene group, a linear, branched or cyclic alkylene group comprising a hydroxyl group, an arylene group, a —CONH— group, a —COO— group, a —NHCOO— group, an ether group (—O— group), a thioether group (—S— group) and combinations thereof; $R^3$ is a hydrogen atom or a methyl group; "Polymer" is a polymer chain comprising at least one constitutional unit represented by the following general formula (III) or (IV):

(III)

(IV)

wherein $R^{17}$ is a hydrogen atom or a methyl group; $R^{18}$ is a hydrocarbon group optionally comprising a substituent group, a cyano group or a monovalent group represented by —[(CH($R^{19}$)—CH($R^{20}$)—O]$_x$—$R^{21}$, —[(CH$_2$)$_y$—O]$_z$—$R^{21}$, —[CO—(CH$_2$)$_y$—O]$_z$—$R^{21}$, —CO—O—$R^{22}$ or —O—CO—$R^{23}$; $R^{19}$ and $R^{20}$ are each independently a hydrogen atom or a methyl group; $R^{21}$ is a hydrogen atom, a hydrocarbon group optionally comprising a substituent group, or a monovalent group represented by —CHO, —CH$_2$CHO or —CH$_2$COO$R^{24}$; $R^{22}$ is a hydrocarbon group optionally comprising a substituent group, a cyano group or a monovalent group represented by —[CH($R^{19}$)—CH($R^{20}$)—O]$_x$—$R^{21}$, —[(CH$_2$)$_y$—O]$_z$—$R^{21}$ or —[CO—(CH$_2$)$_y$—O]$_z$—$R^{21}$; $R^{23}$ is an alkyl group comprising 1 to 18 carbon atoms and optionally comprising a substituent group; $R^{24}$ is a hydrogen atom or an alkyl group comprising 1 to 5 carbon atoms;

the substituent group in $R^{18}$, $R^{21}$, $R^{22}$ and $R^{23}$ is at least one selected from the group consisting of a nitro group, a halogen atom, an alkoxy group, a hydroxyl group, a carboxyl group, an amino group, an epoxy group and an isocyanate group, and when $R^{18}$, $R^{21}$, $R^{22}$ and $R^{23}$ are each a group comprising an aromatic ring, the aromatic ring can comprise a substituent group of an alkyl or alkenyl group;

m is an integer of 1 to 5; n and n' are each an integer of 5 to 200; x is an integer of 1 to 18; y is an integer of 1 to 5; and z is an integer of 1 to 18.

4. The metal particle dispersion for electroconductive substrates according to claim 3, wherein the graft copolymer further comprises a constitutional unit represented by the following general formula (V):

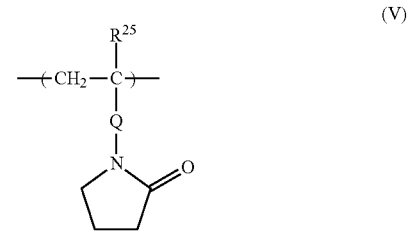

(V)

wherein $R^{25}$ is a hydrogen atom or a methyl group, and "Q" is a direct bond or a divalent linking group, and the divalent linking group as "Q" is at least one selected from the group consisting of an alkylene group comprising 1 to 10 carbon atoms, an arylene group, a —CONH— group, a —COO— group, an ether group comprising 1 to 10 carbon atoms (—R'—OR"— wherein R' and R" are each independently an alkylene group) and combinations thereof.

5. The metal particle dispersion for electroconductive substrates according to claim 3, wherein the metal particles are metal particles containing one or more selected from the group consisting of gold, silver, copper and oxides thereof.

6. A method for producing an electroconductive substrate, comprising the steps of:

forming a coating film by applying, onto a base material, a coating solution which contains a metal particle dispersion for electroconductive substrates, comprising metal particles, a dispersant and an organic solvent, wherein the dispersant is a graft copolymer comprising a constitutional unit represented by the following general formula (I) and a constitutional unit represented by the following general formula (II), and baking the coating film:

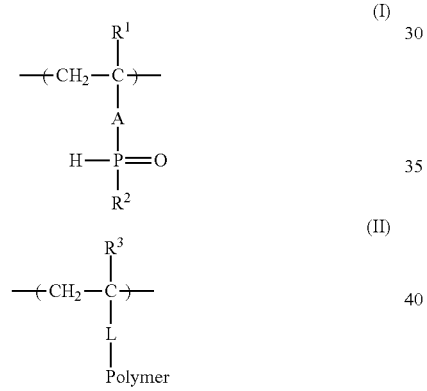

wherein "A" is a direct bond or a divalent linking group, and the divalent linking group as "A" is at least one selected from the group consisting of a linear, branched or cyclic alkylene group, a linear, branched or cyclic alkylene group comprising a hydroxyl group, an arylene group, a —CONH— group, a —COO— group, a —NHCOO— group, an ether group (—O— group), a thioether group (—S— group) and combinations thereof; $R^1$ is a hydrogen atom or a methyl group; $R^2$ is a hydrogen atom, a hydrocarbon group optionally comprising a substituent group, or a monovalent group represented by —[CH($R^4$)—CH($R^6$)—O]$_s$—$R^6$, —[(CH$_2$)$_t$—O]$_u$—$R^6$ or —O—$R^7$; $R^7$ is a hydrocarbon group optionally comprising a substituent group, or a monovalent group represented by —[CH($R^4$)—CH($R^5$)—O]$_s$—$R^6$, —[(CH$_2$)$_t$—O]$_u$—$R^6$, —C($R^8$)($R^9$)—C($R^{10}$)($R^{11}$)—OH or —CH$_2$—C($R^{12}$)($R^{13}$)—CH$_2$—OH;

$R^4$ and $R^5$ are each independently a hydrogen atom or a methyl group; $R^6$ is a hydrogen atom, a hydrocarbon group optionally comprising a substituent group, or a monovalent group represented by —CHO, —CH$_2$CHO, —CO—CH=CH$_2$, —CO—C(CH$_3$)=CH$_2$ or —CH$_2$COO$R^{14}$; $R^{14}$ is a hydrogen atom or an alkyl group comprising 1 to 5 carbon atoms; $R^8$, $R^9$, $R^{10}$, $R^{11}$, $R^{12}$ and $R^{13}$ are each independently a hydrogen atom, a hydrocarbon group optionally comprising a substituent group, or a group in which hydrocarbon groups optionally comprising a substituent group, are bound by at least one of an ether bond and an ester bond, and $R^8$ and $R^{10}$ can be bound to each other to form a cyclic structure; when the cyclic structure is formed, the cyclic structure can comprise a substituent group $R^{15}$, and $R^{15}$ is a hydrogen atom, a hydrocarbon group optionally comprising a substituent group, or a group in which hydrocarbon groups optionally comprising a substituent group, are bound by at least one of an ether bond and an ester bond;

the substituent group in $R^2$, $R^6$, $R^7$, $R^8$, $R^9$, $R^{10}$, $R^{11}$, $R^{12}$, $R^{13}$ and $R^{15}$ is at least one selected from the group consisting of a nitro group and a halogen atom, and when $R^2$, $R^6$, $R^7$, $R^8$, $R^9$, $R^{10}$, $R^{11}$, $R^{12}$, $R^{13}$ and $R^{15}$ are each a group comprising an aromatic ring, the aromatic ring can comprise a substituent group of an alkyl or alkenyl group;

s is an integer of 1 to 18; t is an integer of 1 to 5; and u is an integer of 1 to 18;

wherein "L" is a direct bond or a divalent linking group, and the divalent linking group as "L" is at least one selected from the group consisting of a linear, branched or cyclic alkylene group, a linear, branched or cyclic alkylene group comprising a hydroxyl group, an arylene group, a —CONH— group, a —COO— group, a —NHCOO— group, an ether group (—O— group), a thioether group (—S— group) and combinations thereof; $R^3$ is a hydrogen atom or a methyl group; "Polymer" is a polymer chain comprising at least one constitutional unit represented by the following general formula (III) or (IV):

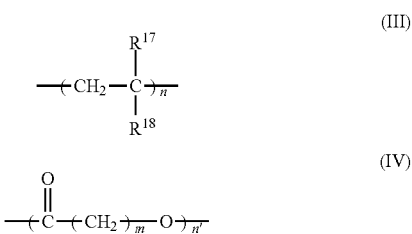

wherein $R^{17}$ is a hydrogen atom or a methyl group; $R^{18}$ is a hydrocarbon group optionally comprising a substituent group, a cyano group or a monovalent group represented by —[CH($R^{19}$)—CH($R^{20}$)—O]$_x$—$R^{21}$, —[(CH$_2$)$_y$—O]$_z$—$R^{21}$, —[CO—(CH$_2$)$_y$—O]$_z$—$R^{21}$, —CO—O—$R^{22}$ or —O—CO—$R^{23}$; $R^{19}$ and $R^{20}$ are each independently a hydrogen atom or a methyl group;

$R^{21}$ is a hydrogen atom, a hydrocarbon group optionally comprising a substituent group, or a monovalent group represented by —CHO, —CH$_2$CHO or —CH$_2$COO$R^{24}$; $R^{22}$ is a hydrocarbon group optionally comprising a substituent group, a cyano group or a monovalent group represented by —[CH($R^{19}$)—CH($R^{20}$)—O]$_x$—$R^{21}$, —[(CH$_2$)$_y$—O]$_z$—$R^{21}$ or —[CO—(CH$_2$)$_y$—O]$_x$—$R^{21}$; $R^{23}$ is an alkyl group comprising 1 to 18 carbon atoms and optionally comprising a substituent group; $R^{24}$ is a hydrogen atom or an alkyl group comprising 1 to 5 carbon atoms;

the substituent group in $R^{18}$, $R^{21}$, $R^{22}$ and $R^{23}$ is at least one selected from the group consisting of a nitro group, a halogen atom, an alkoxy group, a hydroxyl group, a carboxyl group, an amino group, an epoxy group and an isocyanate group, and when $R^{18}$, $R^{21}$, $R^{22}$ and $R^{23}$ are each a group comprising an aromatic ring, the aromatic ring can comprise a substituent group of an alkyl or alkenyl group;

m is an integer of 1 to 5; n and n' are each an integer of 5 to 200; x is an integer of 1 to 18; y is an integer of 1 to 5; and z is an integer of 1 to 18.

7. The method for producing an electroconductive substrata according to claim 6, wherein the graft copolymer further comprises a constitutional unit represented by the following general formula (V):

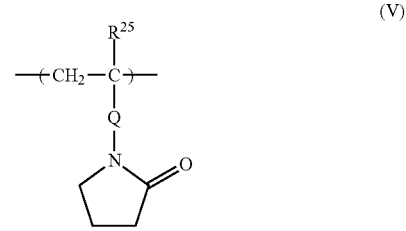

(V)

wherein $R^{25}$ is a hydrogen atom or a methyl group, and "Q" is a direct bond or a divalent linking group, and the divalent linking group as "Q" is at least one selected from the group consisting of an alkylene group comprising 1 to 10 carbon atoms, an arylene group, a —CONH— group, a —COO— group, an ether group comprising 1 to 10 carbon atoms (—R'—OR"— wherein R' and R" are each independently an alkylene group) and combinations thereof.

8. The method for producing an electroconductive substrate according to claim 6, wherein the metal particles are metal particles containing one or more selected from the group consisting of gold, silver, copper and oxides thereof.

* * * * *